United States Patent

Majumdar et al.

[11] Patent Number: 5,672,910
[45] Date of Patent: Sep. 30, 1997

[54] SEMICONDUCTOR DEVICE AND SEMICONDUCTOR MODULE

[75] Inventors: Gourab Majumdar; Satoshi Mori; Sukehisa Noda; Tooru Iwagami; Yoshio Takagi; Hisashi Kawafuji, all of Tokyo, Japan

[73] Assignee: Mitsubishi Denki Kabushiki Kaisha, Tokyo, Japan

[21] Appl. No.: 663,408

[22] Filed: Jun. 13, 1996

[30] Foreign Application Priority Data

Nov. 30, 1995 [JP] Japan .................. 7-312558

[51] Int. Cl.$^6$ .............. H01L 23/48; H01L 23/52
[52] U.S. Cl. .............. 257/690; 257/701; 257/706; 257/707; 257/730
[58] Field of Search .............. 257/690, 701, 257/706, 707, 730, 487

[56] References Cited

U.S. PATENT DOCUMENTS 5,019,942  5/1991  Clemens .................. 361/388
5,063,434  11/1991  Emoto .................. 357/72

FOREIGN PATENT DOCUMENTS 62-152451  9/1987  Japan .
62-204340  12/1987  Japan .

Primary Examiner—Sara W. Crane
Assistant Examiner—Douglas Wille
Attorney, Agent, or Firm—Oblon, Spivak, McClelland, Maier & Neustadt, P.C.

[57] ABSTRACT

It is an object to downsize a device while maintaining a high breakdown voltage. An external terminal (7) protrudes to the outside from the side wall of a sealing resin (2) and a heat sink (1) is exposed in the bottom of the sealing resin (2). A step surface (21) retracted from the exposed surface of the heat sink (1) is formed in the part of the sealing resin (2) surrounding the periphery of the heat sink (1). When using this semiconductor device, the exposed surface of the heat sink (1) is brought into surface contact with the flat surface (41a) of the radiation fin (41) and an insulation sheet (31) is interposed between the step surface (21) and the flat surface (41a), and which is pressed therebetween. The insulation sheet (31) is disposed to cover the region facing the external terminal (7) in the flat surface (41a). Accordingly, it is possible to set the height of the external terminal (7) from the exposed surface of the heat sink (1) lower than the spatial distance determined on the basis of the rated voltage while keeping the breakdown voltage between the external terminal (7) and the radiation fin (41) as the rated voltage.

18 Claims, 12 Drawing Sheets

SEMICONDUCTOR DEVICE AND SEMICONDUCTOR MODULE

BACKGROUND OF THE INVENTION

1. Field of the Invention

The present invention relates to a semiconductor device having a lead frame and a power semiconductor element mounted thereon, which are sealed with a resin, and to a semiconductor module formed by attaching this semiconductor device to a radiation fin, and particularly to improvement for downsizing the device and facilitating the manufacturing process while maintaining the high breakdown voltage.

2. Description of the Background Art

FIG. 20 and FIG. 21 are respectively a bottom view and a front view of a conventional semiconductor device as the background of this invention. FIG. 22 is a sectional view taken along the line X—X in FIG. 20. As shown in these figures, the power semiconductor element 11 is soldered in a certain position on the sheet-like lead frame 3 in this device 151. The power semiconductor element 11 and other portions of the lead frame 3 are electrically connected through the bonding wire 13. The lead frame 3 forms the interconnection pattern of the circuit including the power semiconductor element 11 and also forms the external terminals 7 for making electric connection to external devices.

This device 151 is further provided with a plate-like heat sink 1 which faces the main surface of the lead frame 3 on the side opposite to the element mounting surface of the lead frame 3. The electrically insulating sealing resin 2 seals in the lead frame 3 except the external terminals 7, the elements mounted thereon and the heat sink 1. The external terminals 7 and the heat sink 1 are electrically insulated from each other by the sealing resin 2.

The main surface of the heat sink 1 on the side opposite to the lead frame 3 is exposed to the outside of the device. The external terminals 7 protrude to the outside from the side walls of the sealing resin 2, and they are bent so that their ends protrude in the direction opposite to the orientation of the exposed surface of the heat sink 1.

In ordinary usage of this device 151, as shown in FIG. 22, the device 151 is fixed to the radiation fin 41. At this time the exposed surface of the heat sink 1 comes in surface contact with the flat surface of the radiation fin 41. This allows the loss heat generated in the power semiconductor element 11 to be efficiently radiated from the heat sink 1 to the radiation fin 41.

The conventional device 151 constituted and used in this way has following problems. That is to say, a high voltage is applied to the lead frame 3 because the power semiconductor element 11 is mounted on the lead frame 3. Accordingly, a spatial distance and a creeping distance as large as corresponding to the rated value of the breakdown voltage of the device, i.e., the rated voltage, must be kept between the externally exposed external terminals 7 and the radiation fin 41.

Accordingly, the interval between the external terminals 7 and the radiation fin 41 must be set large. This produces the problem that the device 151 must be large-sized. Furthermore, as it is necessary to set the interval between the lead frame 3 and the heat sink 1 small as 1 mm or below, the thickness of the heat sink 1 must be especially large. This results in a decrease in heat radiation efficiency in addition to the increased cost of the device.

Another conventional device shown in the sectional view of FIG. 23 is appearing to solve this problem. In this device 152, the lead frame 3 is bent to have a step-like sectional form. This allows the heat sink to be thinned to downsize the device 152, and also ensures a large distance between the external terminals 7 and the radiation fin 41.

In this device 152, however, complicated bending must additionally be applied to the lead frame 3, which can not avoid cost up due to the bending process. Furthermore, the complicated form of the lead frame 3 requires special jigs to carry out the die-bonding process for affixing the power semiconductor element 11 on the lead frame 3, the wire-bonding process for coupling the bonding wire 13, the transport process of transporting the lead frame 3, etc. This results in more complicated manufacturing process, inevitably followed by an increase in cost required for manufacturing.

SUMMARY OF THE INVENTION

A first aspect of the present invention is directed to a semiconductor device, which includes: a lead frame like a sheet being electrically conductive and having first and second main surfaces and having therearound a plurality of external terminals outwardly projecting; a power semiconductor element fixed on the first main surface; a heat sink like a plate being thermally conductive and having third and fourth main surfaces and provided so that the third main surface faces the second main surface with a gap therebetween; and a sealing resin having electrically insulating properties and sealing the power semiconductor element, the lead frame, and the heat sink so that the plurality of external terminals and the fourth main surface are exposed to an outside; the plurality of external terminals having a high breakdown voltage terminal requiring a breakdown voltage corresponding to a rated voltage in relation to the heat sink; wherein a portion interposed between the high breakdown voltage terminal and the fourth main surface in an outer surface of the sealing resin has a surface shape capable of pressing and holding a sheet having elasticity with an external flat surface in surface contact with the fourth main surface; and a height of the plurality of external terminals measured from the fourth main surface is smaller than a permissible shortest spatial distance corresponding to the rated voltage.

Preferably, according to a second aspect, the portion of the outer surface has a step surface retracted from the fourth main surface.

Preferably, according to a third aspect, the portion of the outer surface has a surface inclined at a gentle angle with respect to the fourth main surface to such an extent that the sheet can be pressed and held.

Preferably, according to a fourth aspect, the portion of the outer surface has a convex curved surface.

A fifth aspect of the present invention is directed to a semiconductor device which includes: a lead frame like a sheet being electrically conductive and having first and second main surfaces and having therearound a plurality of external terminals outwardly projecting; a power semiconductor element fixed on the first main surface; a heat sink like a plate being thermally conductive and having third and fourth main surfaces and provided so that the third main surface faces the second main surface with a gap therebetween; and a sealing resin having electrically insulating properties and sealing the power semiconductor element, the lead frame, and the heat sink so that the plurality of external terminals and the fourth main surface are exposed to an outside; the plurality of external terminals having a high breakdown voltage terminal requiring a breakdown voltage corresponding to a rated voltage in relation to the heat sink; wherein a creeping distance between the high breakdown voltage terminal and the heat sink along an outer surface of the sealing resin is equal to or larger than a permissible shortest creeping distance corresponding to the rated voltage; and a height of the external terminals measured from the fourth main surface is smaller than a permissible shortest spatial distance corresponding to the rated voltage.

Preferably, according to a sixth aspect, the outer surface has a peripheral portion surrounding the fourth main surface and forming the same plane with the fourth main surface, a creeping distance between the high breakdown voltage terminal and the peripheral portion along the outer surface is equal to or larger than the permissible shortest creeping distance corresponding to the rated voltage, and a spatial distance between the high breakdown voltage terminal and the peripheral portion is equal to or larger than the permissible shortest spatial distance corresponding to the rated voltage.

Preferably, according to a seventh aspect, a portion interposed between the high breakdown voltage terminal and the heat sink in the outer surface has a step surface retracted from the fourth main surface.

Preferably, according to an eighth aspect, a portion interposed between the high breakdown voltage terminal and the heat sink in the outer surface has a surface inclined at an obtuse angle with respect to the fourth main surface.

Preferably, according to a ninth aspect, a portion interposed between the high breakdown voltage terminal and the heat sink in the outer surface has a curved surface.

A tenth aspect of the present invention is directed to a semiconductor device, which includes: a lead frame like a sheet being electrically conductive and having first and second main surfaces and having therearound a plurality of external terminals outwardly projecting; a power semiconductor element fixed on the first main surface; and a sealing resin having electrically insulating properties and sealing the power semiconductor element and the lead frame so that the plurality of external terminals are exposed to an outside; the plurality of external terminals having a high breakdown voltage terminal requiring a breakdown voltage corresponding to a rated voltage in relation to a ground potential; wherein the sealing resin has a portion covering the second main surface side of the lead frame; an outer surface of the portion has a flat plane on the side opposite to the lead frame; a height of the plurality of external terminals from the flat plane is smaller than a permissible shortest spatial distance corresponding to the rated voltage; and the outer surface of the portion further has a step surface retracted from the flat plane in a portion interposed between the high breakdown voltage terminal and the flat plane.

An eleventh aspect of the present invention is directed to a semiconductor module, which includes a semiconductor device, an insulation sheet having electrically insulating properties and elasticity, and a heat radiating means being thermally conductive and having a flat surface; wherein the semiconductor device comprises, a lead frame like a sheet being electrically conductive and having first and second main surfaces and having therearound a plurality of external terminals outwardly projecting, a power semiconductor element fixed on the first main surface, a heat sink like a plate being thermally conductive and having third and fourth main surfaces and provided so that the third main surface faces the second main surface with a gap therebetween, and a sealing resin having electrically insulating properties and sealing the power semiconductor element, the lead frame, and the heat sink so that the plurality of external terminals and the fourth main surface are exposed to an outside, the plurality of external terminals having a high breakdown voltage terminal requiring a breakdown voltage corresponding to a rated voltage in relation to the heat sink; the semiconductor device is fixed to the heat radiating means so that the fourth main surface is in surface contact with the flat surface; a portion interposed between the high breakdown voltage terminal and the fourth main surface in an outer surface of the sealing resin has a surface shape capable of pressing and holding the insulation sheet with the flat surface; a height of the plurality of external terminals measured from the fourth main surface is smaller than a permissible shortest spatial distance corresponding to the rated voltage; and the insulation sheet is held and pressed at its edge portion between the portion of the outer surface and the flat surface and covers a region of the flat surface facing the high breakdown voltage terminal so that a spatial distance and a creeping distance between the high breakdown voltage terminal and the flat surface are equal to or larger than the permissible shortest spatial distance and a permissible shortest creeping distance corresponding to the rated voltage, respectively.

A twelfth aspect of the present invention is directed to a semiconductor module which includes a semiconductor device, a insulation sheet having electrically insulating properties, and a heat radiating means being thermally conductive and having a flat surface; wherein the semiconductor device comprises, a lead frame like a sheet being electrically conductive and having first and second main surfaces and having therearound a plurality of external terminals outwardly projecting, a power semiconductor element fixed on the first main surface, a heat sink like a plate being thermally conductive and having third and fourth main surfaces and provided so that the third main surface faces the second main surface with a gap therebetween, and a sealing resin having electrically insulating properties and sealing the power semiconductor element, the lead frame, and the heat sink so that the plurality of external terminals and the fourth main surface are exposed to an outside, the plurality of external terminals having a high breakdown voltage terminal requiring a breakdown voltage corresponding to a rated voltage in relation to the heat sink; the semiconductor device is fixed to the heat radiating means so that the fourth main surface is in surface contact with the flat surface; a creeping distance between the high breakdown voltage terminal and the heat sink along an outer surface of the sealing resin is equal to or larger than a permissible shortest creeping distance corresponding to the rated voltage; a height of the plurality of external terminals measured from the fourth main surface is smaller than a permissible shortest spatial distance corresponding to the rated voltage; and the insulation sheet covers a region of the flat surface facing the high breakdown voltage terminal so that a spatial distance and a creeping distance between the high breakdown voltage terminal and the flat surface are equal to or larger than the permissible shortest spatial distance and the permissible shortest creeping distance corresponding to the rated voltage, respectively.

A thirteenth aspect of the present invention is directed to a semiconductor module, which includes a semiconductor device and a heat radiating means being thermally conductive and having a flat surface, wherein the semiconductor device comprises, a lead frame like a sheet being electrically conductive and having first and second main surfaces and having therearound a plurality of external terminals outwardly projecting, a power semiconductor element fixed on the first main surface, a heat sink like a plate being thermally conductive and having third and fourth main surfaces and provided so that the third main surface faces the second main surface with a gap therebetween, and a sealing resin having electrically insulating properties and sealing the power semiconductor element, the lead frame, and the heat sink so that plurality of the external terminals and the fourth main surface are exposed to an outside, the plurality of external terminals having a high breakdown voltage terminal requiring a breakdown voltage corresponding to a rated voltage in relation to the heat sink; the semiconductor device is fixed to the heat radiating means so that the fourth main surface is in surface contact with the flat surface; a creeping distance between the high breakdown voltage terminal and the heat sink along an outer surface of the sealing resin is equal to or larger than a permissible shortest creeping distance corresponding to the rated voltage; a height of the plurality of external terminals measured from the fourth main surface is smaller than a permissible shortest spatial distance corresponding to the rated voltage; and the heat radiating means has a step surface retracted from the flat surface in a region facing the high breakdown voltage terminal so that a spatial distance and a creeping distance between the heat radiating means and the high breakdown voltage terminal are equal to or larger than the permissible shortest spatial distance and the permissible shortest creeping distance corresponding to the rated voltage, respectively.

A fourteenth aspect of the present invention is directed to a semiconductor module which includes a semiconductor device and a heat radiating means being thermally conductive and having a flat surface, wherein the semiconductor device comprises, a lead frame like a sheet being electrically conductive and having first and second main surfaces and having therearound a plurality of external terminals outwardly projecting, a power semiconductor element fixed on the first main surface, a heat sink like a plate being thermally conductive and having third and fourth main surfaces and provided so that the third main surface faces the second main surface with a gap therebetween, and a sealing resin having electrically insulating properties and sealing the power semiconductor element, the lead frame, and the heat sink so that the plurality of external terminals and the fourth main surface are exposed to an outside, the plurality of external terminals having a high breakdown voltage terminal requiring a breakdown voltage corresponding to a rated voltage in relation to the heat sink; the semiconductor device is fixed to the heat radiating means so that the fourth main surface is in surface contact with the flat surface; a creeping distance between the high breakdown voltage terminal and the heat sink along an outer surface of the sealing resin is equal to or larger than a permissible shortest creeping distance corresponding to the rated voltage; a height of the plurality of external terminals measured from the fourth main surface is smaller than a permissible shortest spatial distance corresponding to the rated voltage; and the heat radiating means has a step surface retracted from the flat surface out of a region facing the high breakdown voltage terminal so that a spatial distance and a creeping distance between the heat radiating means and the high breakdown voltage terminal are equal to or larger than the permissible shortest spatial distance and the permissible shortest creeping distance corresponding to the rated voltage, respectively.

A fifteenth aspect of the present invention is directed to a semiconductor module which includes a semiconductor device, a insulation sheet having electrically insulating properties and elasticity, and a heat radiating means being thermally conductive and having a flat surface; wherein the semiconductor device comprises, a lead frame like a sheet being electrically conductive and having first and second main surfaces and having therearound a plurality of external terminals outwardly projecting, a power semiconductor element fixed on the first main surface, and a sealing resin having electrically insulating properties and sealing the power semiconductor element and the lead frame so that the plurality of external terminals are exposed to an outside; wherein the sealing resin has a portion covering the second main surface of the lead frame; an outer surface of the portion has a flat plane on a side opposite to the lead frame; the semiconductor device is fixed to the heat radiating means so that the flat plane is in surface contact with the flat surface; the plurality of external terminals have a high breakdown voltage terminal requiring a breakdown voltage corresponding to a rated voltage in relation to the heat radiating means; a height of the plurality of external terminals from the flat plane is smaller than a permissible shortest spatial distance corresponding to the rated voltage; the outer surface of the portion further has a step surface retracted from the flat plane in a portion interposed between the high breakdown voltage terminal and the flat plane; and the insulation sheet is held and pressed at its edge portion between the step surface and the flat surface and covers a region facing the high breakdown voltage terminal in the flat surface so that a spatial distance and a creeping distance between the high breakdown voltage terminal and the flat surface are equal to or larger than the permissible shortest spatial distance and a permissible shortest creeping distance corresponding to the rated voltage, respectively.

According to the device of the first aspect, the outer surface of the sealing resin interposed between the high breakdown voltage terminal and the exposed surface (the fourth main surface) of the heat sink has a surface shape capable of pressing and holding a sheet having elasticity with the external flat surface in surface contact with the exposed surface of the heat sink. Accordingly, when using it with the exposed surface of the heat sink being in surface contact with heat radiating means such as a radiation fin having a flat surface, a breakdown voltage corresponding to the rated voltage can be obtained by preparing an insulation sheet having elasticity, such as a resin, holding and pressing its edge portion between the outer surface of the sealing resin and the flat surface of the heat radiating means, and disposing it to cover the region facing the high breakdown voltage terminal in the flat surface so that the spatial distance and the creeping distance between the high breakdown voltage terminal and the flat surface are equal to or larger than the permissible shortest spatial distance and the permissible shortest creeping distance corresponding to the rated voltage of the device, respectively.

That is to say, in spite of that the height of the external terminals measured from the exposed surface of the heat sink is smaller than the permissible shortest spatial distance corresponding to the rated voltage of the device, and accordingly that the device is small-sized, a breakdown voltage corresponding to the rated voltage can be realized.

According to the device of the second aspect, the outer surface of the sealing resin interposed between the high breakdown voltage terminal and the exposed surface of the heat sink has a step surface retracted from this exposed surface, so that the insulation sheet can easily be put between this step surface and the flat surface of the heat radiating means and pressed.

According to the device of the third aspect, since the outer surface of the sealing resin interposed between the high breakdown voltage terminal and the exposed surface of the heat sink has a surface inclined at a gentle angle with respect to this exposed surface, it is possible to easily put and press the insulation sheet between this inclined surface and the flat surface of the heat radiating means.

According to the device of the fourth aspect, since the outer surface and the sealing resin interposed between the high breakdown voltage terminal and the exposed surface of the heat sink has a convex curved surface, it is possible to easily put and press the insulation sheet between this convex curved surface and the flat surface of the heat radiating means.

According to the device of the fifth aspect, the creeping distance between the high breakdown voltage terminal and the heat sink along the outer surface of the sealing resin is equal to or larger than the permissible shortest creeping distance corresponding to the rated voltage of the device. Accordingly, when using it with the exposed surface of the heat sink being in surface contact with heat radiating means such as a radiation fin having a flat surface, a breakdown voltage corresponding to the rated voltage can be obtained by using heat radiating means having a step surface retracted from the flat surface in the region facing the high breakdown voltage terminal, for example, so that the spatial distance and the creeping distance between the heat radiating means and the high breakdown voltage terminal are equal to or larger than the permissible shortest spatial distance and the permissible shortest creeping distance corresponding to the rated voltage of the device, respectively.

That is to say, in spite of the fact that the height of the external terminals measured from the exposed surface of the heat sink is smaller than the permissible shortest spatial distance corresponding to the rated voltage of the device, and accordingly that the device is downsized, a breakdown voltage corresponding to the rated voltage can be realized.

According to the device of the sixth aspect, the spatial distance between the high breakdown voltage terminal and the peripheral portion and the creeping distance between the high breakdown voltage terminal and the peripheral portion along the outer surface of the sealing resin are equal to or larger than the permissible shortest spatial distance and the permissible shortest creeping distance corresponding to the rated voltage of the device, respectively. Accordingly, when using it with the exposed surface of the heat sink being in surface contact with heat radiating means having a flat surface larger than the exposed surface of the heat sink, a breakdown voltage corresponding to the rated voltage can be obtained by preparing an insulation sheet and covering the region facing the high breakdown voltage terminal in the flat surface with this insulation sheet so that the spatial distance and the creeping distance between the high breakdown voltage terminal and the flat surface are equal to or larger than the permissible shortest spatial distance and the permissible shortest creeping distance corresponding to the rated voltage, respectively.

That is to say, in spite of the fact that the height of the external terminals measured from the exposed surface of the heat sink is smaller than the permissible shortest spatial distance corresponding to the rated voltage of the device, and accordingly that the device is small-sized, a breakdown voltage corresponding to the rated voltage can be realized. Furthermore, it is possible to use heat radiating means with simple configuration having no step surface retracted from the flat surface.

According to the device of the seventh aspect, since the portion of the outer surface of the sealing resin interposed between the high breakdown voltage terminal and the heat sink has a step surface retracted from the exposed surface of the heat sink, it is easy to ensure a long creeping distance between the heat sink and the high breakdown voltage terminal, or between the external heat radiating means, with which the heat sink is to be in surface contact when used, and the high breakdown voltage terminal while maintaining the small size of the device.

According to the device of the eighth aspect, the portion of the outer surface of the sealing resin interposed between the high breakdown voltage terminal and the heat sink has a surface inclined at an obtuse angle with respect to the exposed surface of the heat sink, which is suitable for the usage in which the insulation sheet is disposed in the region facing the high breakdown voltage terminal on the surface of the heat radiating means to obtain a certain breakdown voltage. Furthermore, its production is easy.

According to the device of the ninth aspect, since the portion of the outer surface of the sealing resin interposed between the high breakdown voltage terminal and the heat sink has a curved surface, the creeping distance between the heat sink and the high breakdown voltage terminal, or between the external heat radiating means, with which the heat sink is to be in surface contact when used, and the high breakdown voltage terminal can easily be ensured long while maintaining the small size of the device.

According to the device of the tenth aspect, since the sealing resin covering the second main surface has a flat plane exposed to the outside on the side opposite to the lead frame, an external radiation fin, or the like, having a flat surface can be brought in contact with this flat plane to increase the heat radiation efficiency. Furthermore, as the step surface retracted from the flat plane is formed in the outer surface of the sealing resin interposed between the high breakdown voltage terminal and the flat plane, a breakdown voltage corresponding to the rated voltage can be obtained by holding and pressing the edge portion of the insulation sheet having elasticity such as a resin between the flat plane of the sealing resin and the radiation fin and covering the region facing the high breakdown voltage terminal in the radiation fin with the insulation sheet so that the spatial distance and the creeping distance between the high breakdown voltage terminal and the radiation fin are equal to or larger than the permissible shortest spatial distance and the permissible shortest creeping distance corresponding to the rated voltage of the device, respectively.

That is to say, despite of the fact that the height of the external terminal measured from the flat plane of the sealing resin is smaller than the permissible shortest spatial distance corresponding to the rated voltage of the device, and accordingly that the device is downsized, a breakdown voltage corresponding to the rated voltage can be realized. Also, as it does not necessarily require the heat sink, the size of the device can be reduced considerably. The manufacturing cost is also reduced.

According to the module of the eleventh aspect, as the semiconductor device is fixed to the heat radiating means, it is not necessary to separately prepare the heat radiating means when using the semiconductor device. Furthermore, a breakdown voltage is realized corresponding to the rated voltage of the semiconductor device because the edge portion of the insulation sheet having elasticity such as a resin is held with pressure between the outer surface of the sealing resin and the flat surface of the heat radiating means and the insulation sheet covers the region facing the high breakdown voltage terminal in the flat surface so that the spatial distance and the creeping distance between the high breakdown voltage terminal and the flat surface are equal to or larger than the permissible shortest spatial distance and the permissible shortest creeping distance corresponding to the rated voltage of the semiconductor device, respectively.

That is to say, a breakdown voltage corresponding to the rated voltage is obtained by using a semiconductor device in which the height of the external terminal measured from the exposed surface of the heat sink is smaller than the permissible shortest spatial distance corresponding to the rated voltage, that is, by using a small-sized semiconductor device.

According to the module of the twelfth aspect, as the semiconductor device is fixed to the heat radiating means, it is not necessary to separately prepare the heat radiating means when using the semiconductor device. Furthermore, a breakdown voltage is realized corresponding to the rated voltage of the semiconductor device because the insulation sheet covers the region facing the high breakdown voltage terminal in the flat surface so that the spatial distance and the creeping distance between the high breakdown voltage terminal and the flat surface of the heat radiating means are equal to or larger than the permissible shortest spatial distance and the permissible shortest creeping distance corresponding to the rated voltage of the semiconductor device, respectively.

That is to say, a breakdown voltage corresponding to the rated voltage is obtained by using a semiconductor device in which the height of the external terminal measured from the exposed surface of the heat sink is smaller than the permissible shortest spatial distance corresponding to the rated voltage, that is, by using a small-sized semiconductor device. Furthermore, since the heat radiating means does not have to have a step surface retracted from the flat surface, production of the heat radiating means is easy.

According to the module of the thirteenth aspect, as the semiconductor device is fixed to the heat radiating means, it is not necessary to separately prepare the heat radiating means when using the semiconductor device. Also, a breakdown voltage corresponding to the rated voltage of the semiconductor device is realized because the heat radiating means has in the region facing the high breakdown voltage terminal a step surface retracted from the flat surface in surface contact with the exposed surface of the heat sink so that the spatial distance and the creeping distance between the heat radiating means and the high breakdown voltage terminal are equal to or larger than the permissible shortest spatial distance and the permissible shortest creeping distance corresponding to the rated voltage of the semiconductor device, respectively.

Formation of the step surface in the heat radiating means allows the spatial distance between the high breakdown voltage terminal and the heat radiating means, i.e., the height of the high breakdown voltage terminal from the step surface to be set to a required arbitrary value by increasing/decreasing its step width. Also, by adjusting the boundary position between the flat surface and the step surface, the creeping distance between the high breakdown voltage terminal and the heat radiating means can be adjusted. This way, this semiconductor module can realize downsizing of the semiconductor device and a breakdown voltage as rated by appropriately setting the surface configuration of the heat radiating means without using the insulation sheet.

According to the module of the fourteenth aspect, as the semiconductor device is fixed to the heat radiating means, it is not necessary to separately prepare the heat radiating means when using the semiconductor device. Also, a breakdown voltage corresponding to the rated voltage of the semiconductor device is realized because the heat radiating means has a step surface retracted from the flat surface in surface contact with the exposed surface of the heat sink outside of the region facing the high breakdown voltage terminal so that the spatial distance and the creeping distance between the heat radiating means and the high breakdown voltage terminal are equal to or larger than the permissible shortest spatial distance and the permissible shortest creeping distance corresponding to the rated voltage, respectively.

Since the step surface is formed in the heat radiating means and the step surface is off the region facing the high breakdown voltage terminal, it is possible to set large the spatial distance between the high breakdown voltage terminal and the heat radiating means, i.e., the distance between the high breakdown voltage terminal and the outer periphery of the step surface by separating the outer periphery of the step surface away from this region. That is to say, this increases the degree of freedom in designing the step width. Also, the creeping distance between the high breakdown voltage terminal and the heat radiating means can also be adjusted by adjusting the boundary position between the flat surface and the step surface. In this way, this semiconductor module can realize downsizing of the semiconductor device and a breakdown voltage as rated by appropriately setting the surface configuration of the heat radiating means without using an insulation sheet.

According to the module of the fifteenth aspect, as the semiconductor device is fixed to the heat radiating means, it is not necessary to separately prepare the heat radiating means when using the semiconductor device. Furthermore, a breakdown voltage is realized corresponding to the rated voltage of the semiconductor device because the edge portion of the insulation sheet having elasticity such as a resin is put and pressed between the step surface of the sealing resin and the flat surface of the heat radiating means and the insulation sheet covers the region facing the high breakdown voltage terminal in the flat surface so that the spatial distance and the creeping distance between the high breakdown voltage terminal and the flat surface are equal to or larger than the permissible shortest spatial distance and the permissible shortest creeping distance corresponding to the rated voltage of the semiconductor device, respectively.

That is to say, a breakdown voltage corresponding to the rated voltage is obtained by using a semiconductor device in which the height of the external terminal measured from the exposed surface of the heat sink is smaller than the permissible shortest spatial distance corresponding to the rated voltage, that is, a small-sized semiconductor device.

It is an object of the present invention to provide a semiconductor device capable of downsizing the device and facilitating the production while maintaining a high breakdown voltage, and a semiconductor module formed of this semiconductor device attached to a radiation fin.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
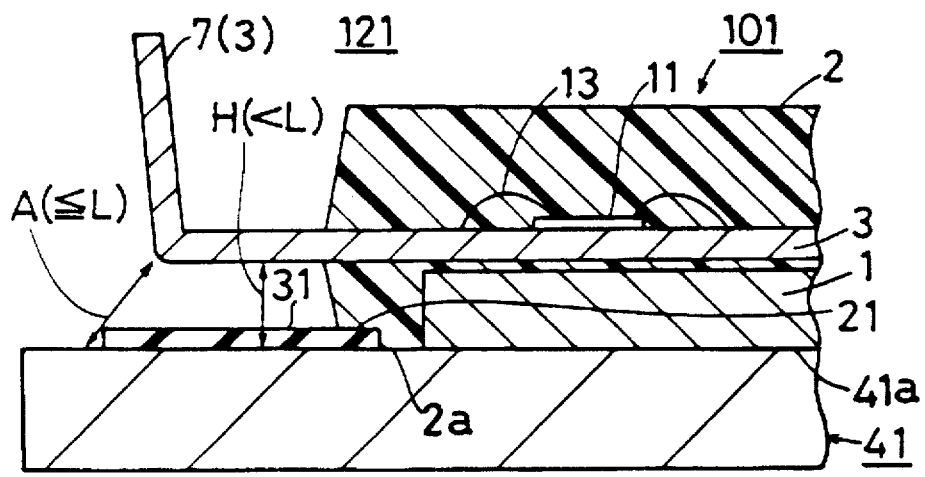
FIG. 1 is a front sectional view of a semiconductor device of a first preferred embodiment.

FIG. 1 is a fragmentary front sectional view of a semiconductor device of the first preferred embodiment. In this semiconductor device 101, the power semiconductor element 11, such as an IGBT element, for example, is fixed with solder in a certain position on the sheet-like lead frame 3 substantially formed of a metal with good electric conductivity, such as copper. Not only the power semiconductor element 11, but also other elements such as a controlling semiconductor element controlling operation of the power semiconductor element 11 may be fixed, for example.

The power semiconductor element 11 with heat generation is preferably formed as a bare chip element, as exemplified in FIG. 1. The power semiconductor element 11 and other portions of the lead frame 3 are electrically connected through the bonding wire 13 made of aluminum, for example. The lead frame 3 has certain pattern configuration, which forms the interconnection pattern of the circuit including the power semiconductor element 11 and also forms the external terminals 7 for making electric connection with an external device.

A plate-like heat sink 1 substantially formed of a metal with good thermal conductivity such as aluminum or copper, for example, is provided to face the lower main surface of the lead frame 3 on the side opposite to its upper main surface on which the power semiconductor element 11 is mounted (the element mounting surface). The sealing resin 2 with an electric insulating property and a good heat conductivity seals up the lead frame 3 except the external terminals 7, the elements provided on the lead frame 3 and the heat sink 1. The portion corresponding to the external terminals 7 in the lead frame 3 protrude outward from the side walls of the sealing resin 2.

A small gap is provided between the lead frame 3 and the heat sink 1, which is filled with the sealing resin 2. The sealing resin 2 put in this gap serves to electrically insulate the lead frame 3 and the heat sink 1 and also to well conduct loss heat generated in the power semiconductor element 11 from the lead frame 3 to the heat sink 1.

The sealing resin 2 put in the gap further serves to fixedly couple the lead frame 3 and the heat sink 1. The sealing resin 2 also completely buries the interconnection pattern 4 and the elements thereon to protect them from external moisture etc.

The sealing resin 2 is formed not only to fill the gap between the lead frame 3 and the heat sink 1 but also to surround the peripheral surface of the heat sink 1. The lower main surface of the heat sink 1, which is on the side opposite to its upper main surface facing the lead frame 3, is exposed to the outside of the device 101. That is to say, with the peripheral portion 2a formed of the sealing resin 2, the lower main surface of the heat sink 1 is selectively exposed in the bottom of the device 101. The peripheral portion 2a is adjacent to this exposed surface of the heat sink 1 along the periphery of the exposed surface.

When used, as shown in FIG. 1, the device 101 is attached to an external radiation fin(heat radiating means) 41. The radiation fin 41 has the flat surface 41a, and the device 101 and the radiation fin 41 are fixed to each other so that the flat surface 41a is in contact with the exposed surface of the heat sink 1. This allows the loss heat generated in the power semiconductor element 11 to be efficiently radiated from the heat sink 1 to the radiation fin 41.

Figure 2:
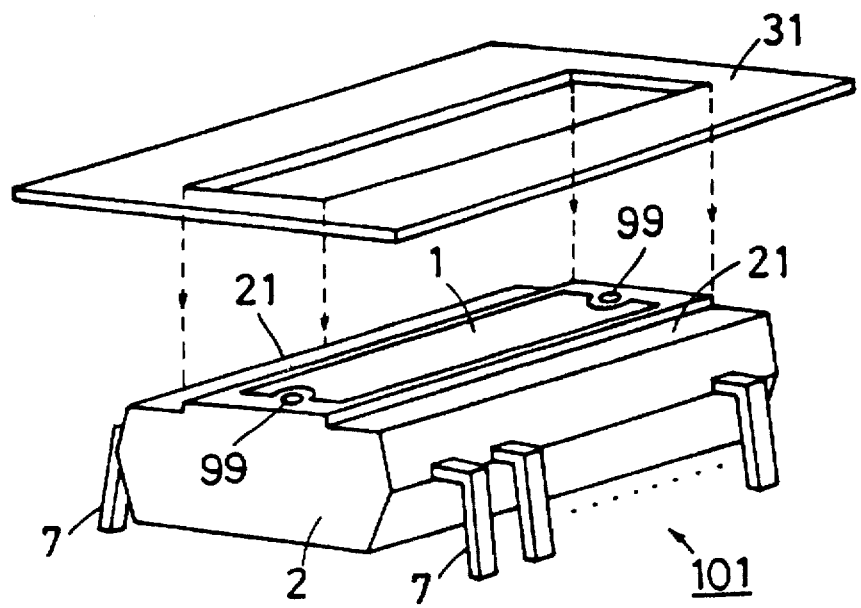
FIG. 2 is a perspective view of the semiconductor device of FIG. 1.

FIG. 2 is an external perspective view of the device 101 seen from the slant direction closer to the bottom. As shown in FIG. 2, the external terminals 7 project from the oppositely-directed two side walls in the side walls in the four directions of the sealing resin 2 almost forming a rectangular prism. The ends of the external terminals 7 are bent to be directed in the direction opposite to the bottom of the device 101 where the heat sink 1 is exposed. That is to say, this device 101 has the so-called DIP type package structure. The sealing resin 2 has a pair of through holes 99 to allow the device 101 to be easily fixed to the radiation fin 41 with screws.

In the above-described peripheral portion 2a, retracted step surfaces 21 are formed along the ridge lines between the side walls from which the external terminals 7 project and the peripheral portion 2a. That is to say, the step surface 21 is retracted from the exposed surface of the heat sink 1, and it is formed along the peripheral edge of the peripheral portion 2a located on the side where the external terminals 7 protrude.

When using the device 101, an insulation sheet 31 is provided for covering the step surfaces 21. The insulation sheet 31 is shaped like a plane selectively having an opening in the center, for example. The bottom of the device 101, except the step surfaces 21, is inserted into this opening.

Referring to FIG. 1 again, the insulation sheet 31 is put between the flat surface 41a of the radiation fin 41 and the step surface 21 for use. Since the insulation sheet 31 has the opening, it is possible to put the insulation sheet 31 between the flat surface 41a of the radiation fin 41 and the step surfaces 21 while maintaining the contact between the heat sink 1 and the radiation fin 41. The insulation sheet 31 is preferably fixed to the flat surface 41a using an adhesive agent, for example.

The insulation sheet 31 is formed of a material having a certain degree of elasticity, such as a resin, for example, which has its thickness set somewhat larger than the depth of the step surface 21, i.e., the step width. Accordingly, when the device 101 and the radiation fin 41 are fixedly coupled to each other so that the exposed surface of the heat sink 1 and the flat surface 41a of the radiation fin 41 come in contact, the insulation sheet 31 is pressed by the flat surface 41a of the radiation fin 41 and the step surfaces 21.

Now, a spatial distance and a creeping distance at a certain degree or above must be kept between the external terminals 7 and the heat sink 1, and between the external terminals 7 and the radiation fin 41 to keep electric insulation. The shortest values in the permitted range are determined by the rated value of the breakdown voltage of the device 101, i.e., the rated voltage. For example, if the rated voltage is AC220V, the permissible shortest values of the spatial distance and the creeping distance are both 6 mm.

In the usage shown in FIG. 1, the insulation sheet 31 is interposed between the flat surface 41a of the radiation fin 41 and the external terminals 7. This enables setting the interval between the external terminals 7 and the radiation fin 41 smaller than the permissible shortest value of the spatial distance. This will be described below.

Figure 3:
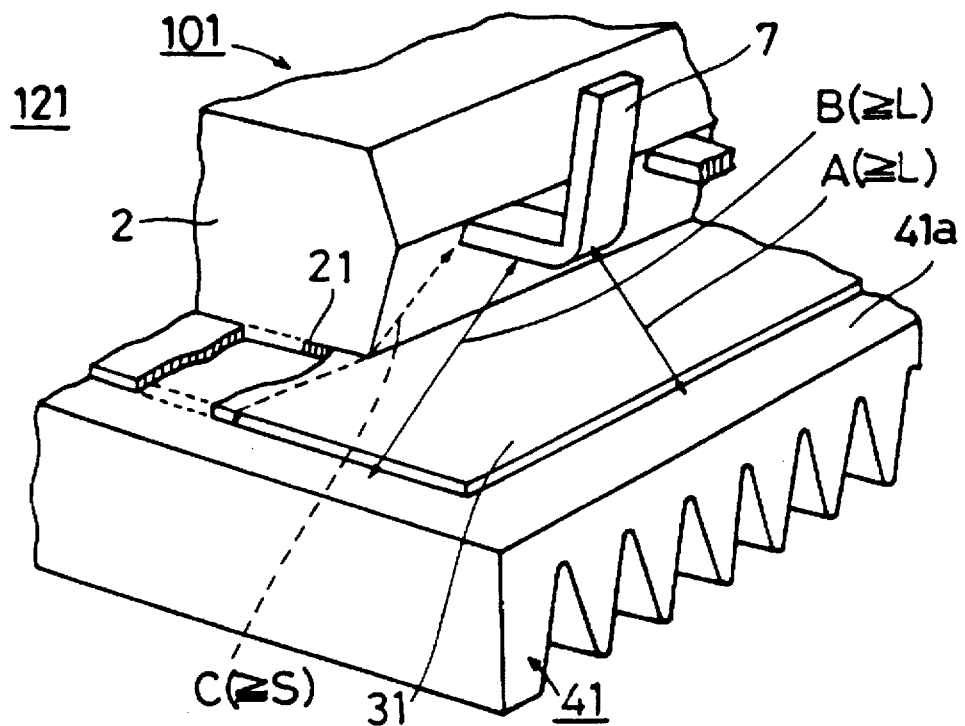
FIG. 3 is a perspective view showing usage of the semiconductor device of FIG. 1.

FIG. 3 is a fragmentary perspective view showing the positional relation among the device 101, the insulation sheet 31 and the radiation fin 41 in the usage of FIG. 1. In this usage, the region facing the external terminals 7 on the flat surface 41a of the radiation fin 41 is covered with the insulation sheet 31. The outline of the insulation sheet 31 is set so that the spatial distance A or B between the radiation fin 41 and the external terminal 7 (a shorter one is the spatial distance) and the creeping distance C are equal to or larger than the spatial distance L and the creeping distance S as the permissible shortest values, respectively.

In this specification, in order to distinguish the spatial distance L and the creeping distance S as permissible shortest values as a kind of reference values from the spatial distance A etc. and the creeping distance C etc. as designed values, they are respectively referred to as the "permissible shortest spatial distance" and the "permissible shortest creeping distance", for convenience.

Since the insulation sheet 31 is pressed between the radiation fin 41 and the step surface 21, discharge does not take place along the creepage(creeping) path from the external terminal 7 through the side wall of the sealing resin 2 and the step surface 21 to the radiation fin 41. Hence, it is not necessary to set the creeping distance of this route equal to or larger than the permissible shortest creeping distance S. As to the creeping distance between the external terminal 7 and the radiation fin 41, only the creeping distance C from the external terminal 7 to the peripheral edge of the insulation sheet 31 shown in FIG. 3 is to be considered.

Similarly, the spatial distances A, B correspond to the spatial distance from the external terminal 7 to the peripheral edge of the insulation sheet 31. Since the insulation sheet 31 covers the region having a certain extent facing the external terminal 7 on the flat surface 41a of the radiation fin 41, these spatial distances A and B are larger than the height H (shown in FIG. 1) of the external terminal 7 from the flat surface 41a of the radiation fin 41 (in other words, from the exposed surface of the heat sink 1).

This allows the height H to be set smaller than the permissible shortest spatial distance L. For example, when the rated voltage of the device is AC220V, it is possible to suppress the height H to a small value of about 4 mm with the spatial distances A and B being equal to or larger than the permissible shortest spatial distance L (=6 mm).

Figure 23:
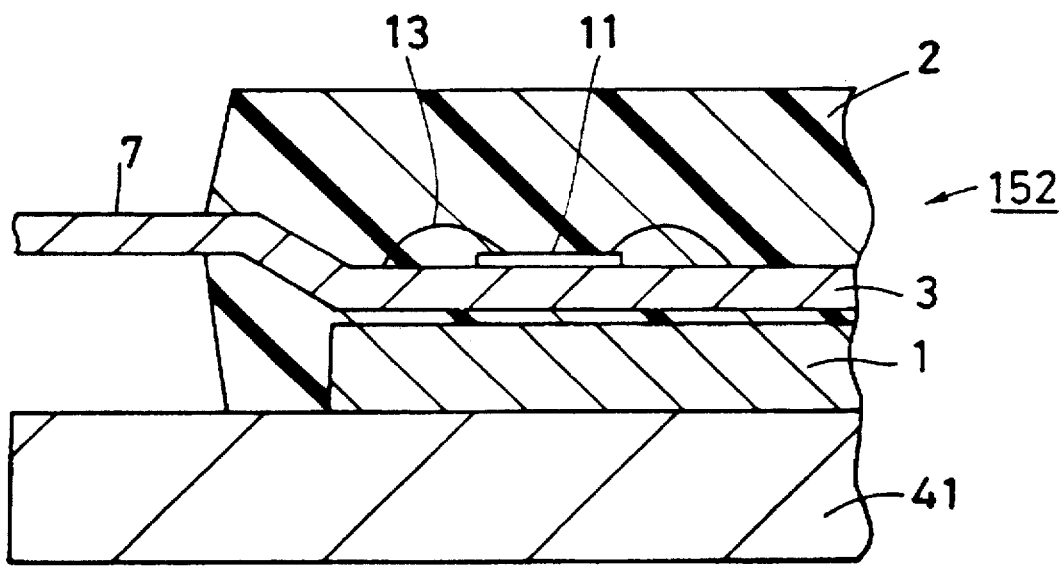
FIG. 23 is a front sectional view showing the usage of another conventional semiconductor device.

Thus, it is possible to set the interval between the exposed surface of the heat sink 1 and the lead frame 3 smaller than the permissible shortest spatial distance L without bending the lead frame 3 into steps as in the conventional device 152 shown in FIG. 23. That is, the device 101 can be downsized without complicating the process of processing the lead frame 3.

The application device having the device 101 attached to the radiation fin 41 with the insulation sheet 31 ensures a breakdown voltage as rated and also ensures good heat radiation characteristics. That is to say, this application device can be made as a product as a useful semiconductor module 121. This can be similarly said about application devices having the semiconductor device, the insulation sheet and the radiation fin described later in the respective preferred embodiments.

Second Preferred Embodiment

The first preferred embodiment has exemplified as an insulation sheet the insulation sheet 31 selectively having an opening in the center and having a rectangular peripheral form. However, it is generally sufficient that the insulation sheet is shaped so that the spatial distance and the creeping distance are respectively equal to or larger than the permissible shortest spatial distance L and the permissible shortest creeping distance S, which is not limited to the shape shown in FIG. 2. In this preferred embodiment, other examples of shapes of the insulation sheet different from that in FIG. 2 will be described.

Figure 4:
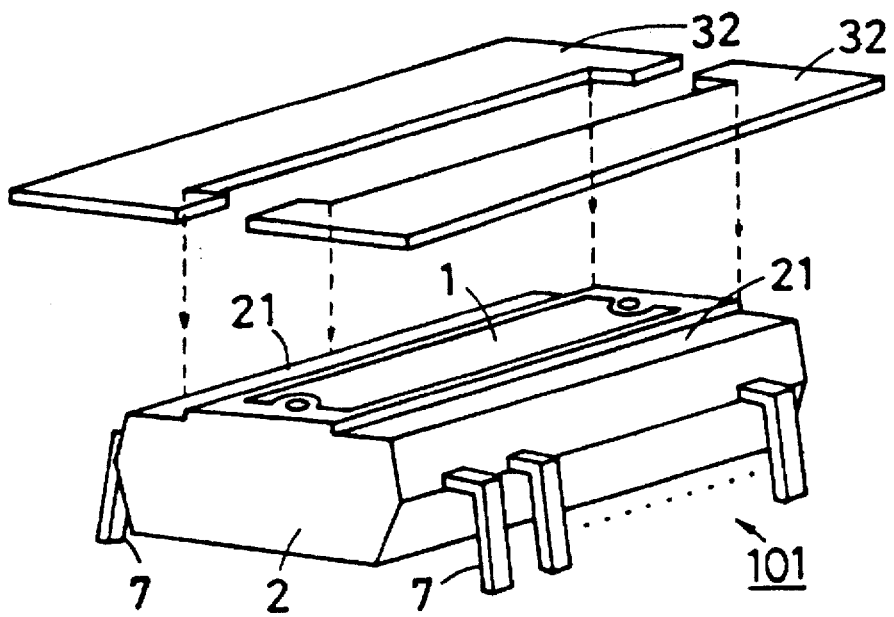
FIG. 4 is a perspective view of an insulation sheet of a second preferred embodiment.

The insulation sheet shown in FIG. 4 is divided into a pair of insulation sheets 32 each having an almost "U-shaped" plane shape. One and the other of the pair of insulation sheets 32 are provided to respectively cover one and the other of the pair of step surfaces 21. That is to say, like the insulation sheet 31, these insulation sheets 32 are interposed and pressed between the step surfaces 21 and the flat surface 41a when the device 101 is fixed to the radiation fin 41.

Figure 5:
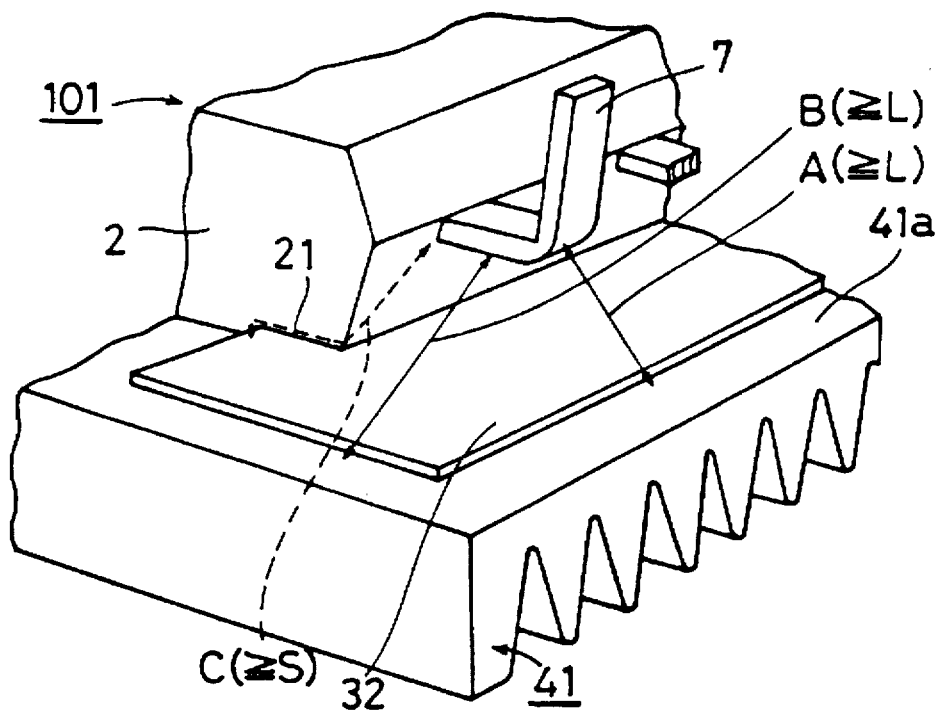
FIG. 5 is a perspective view showing usage of the insulation sheet of FIG. 4.

As shown in the fragmentary perspective view of FIG. 5, when using the insulation sheet 32, in addition to the creepage path shown in FIG. 3, the creepage path from the external terminal 7 through the side wall of the sealing resin 2 and the boundary line between the sealing resin 2 and the insulation sheet 32 to the flat surface 41a must be considered, too. In FIG. 5, this creepage path is shorter, which shows an example in which this creepage path defines the creeping distance C. The shape of the insulation sheet 32 is determined so that the spatial distances A and B are equal to or larger than the permissible shortest spatial distance L and this creeping distance C is equal to or larger than the permissible shortest creeping distance S.

Figure 6:
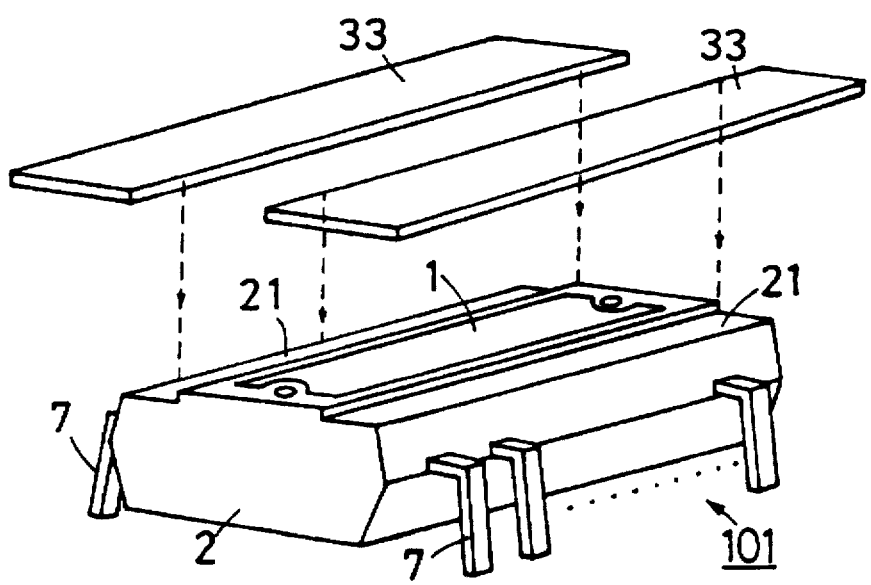
FIG. 6 is a perspective view of another example of the insulation sheet of the second preferred embodiment.

The insulation sheet shown in FIG. 6 is divided into a pair of insulation sheets 33 each having a rectangular plane shape. If the lateral width of the step surface 21 (the width in the direction perpendicular to the elongate direction along the line of the external terminals 7) is large enough, use of these insulation sheets 33 ensures the creeping distance C equal to or larger than the permissible shortest creeping distance S.

Figure 7:
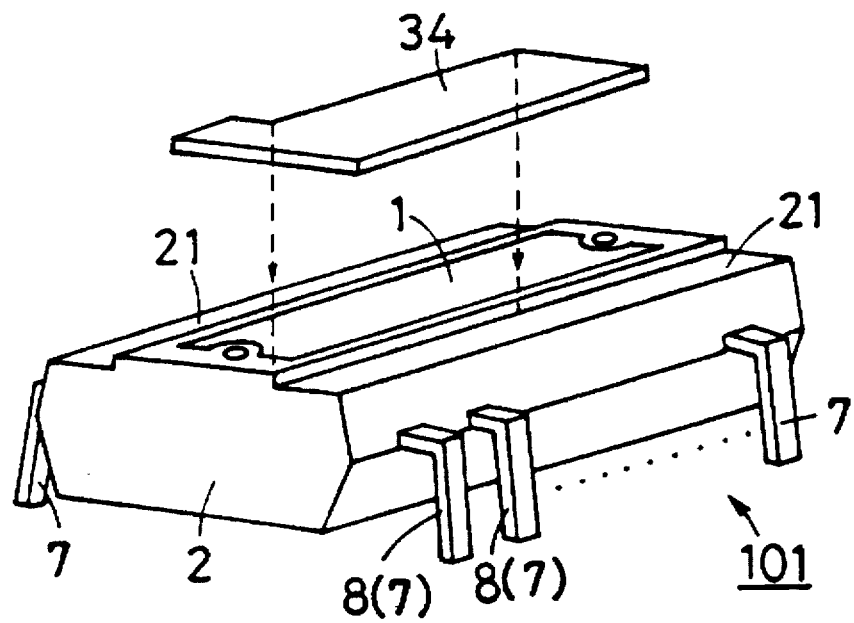
FIG. 7 is a perspective view of still another example of the insulation sheet of the second preferred embodiment.

The insulation sheet 34 exemplified in FIG. 7 is shaped in plan as if only a part of the insulation sheet 32 shown in FIG. 4 were cut off. In the case where the high breakdown voltage terminals 8 which are external terminals requiring the rated breakdown voltage for the radiation fin 41 are limited to a part in the plurality of external terminals 7, the insulation sheet may be disposed only in the region corresponding to the high breakdown voltage terminals 8, as shown in FIG. 7. Although not shown in the figure, the step surface 21 may also be provided only in the part necessary to press the insulation sheet 34, i.e., in the part corresponding to the high breakdown voltage terminals 8.

Figure 8:
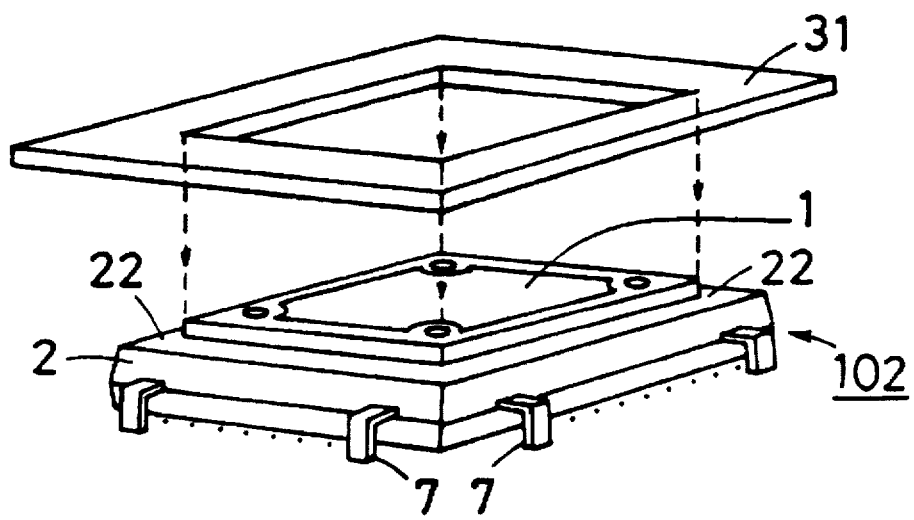
FIG. 8 is a perspective view of another example of the semiconductor device and the insulation sheet of the second preferred embodiment.

In the examples above, the semiconductor device has the DIP type package structure. However, it is possible to use the insulation sheet in semiconductor devices having general package structures other than the DIP type, to compatibly realize the breakdown voltage and the downsizing. FIG. 8 is an external perspective view of a semiconductor device showing an example thereof. The device 102 shown in FIG. 8 has the so-called four-direction flat package structure where the external terminals 7 protrude from all of the side walls in the four directions of the sealing resin 2 almost forming a rectangular prism.

In this device 102, the step surface 22 is formed along the entire peripheral edge of the bottom of the sealing resin 2. The insulation sheet 31 having the opening is provided to cover the step surface 22. That is to say, the insulation sheet 31 is interposed between the flat surface 41a of the radiation fin 41, to which the device 102 is attached, and the step surface 22, and is pressed therebetween.

Figure 9:
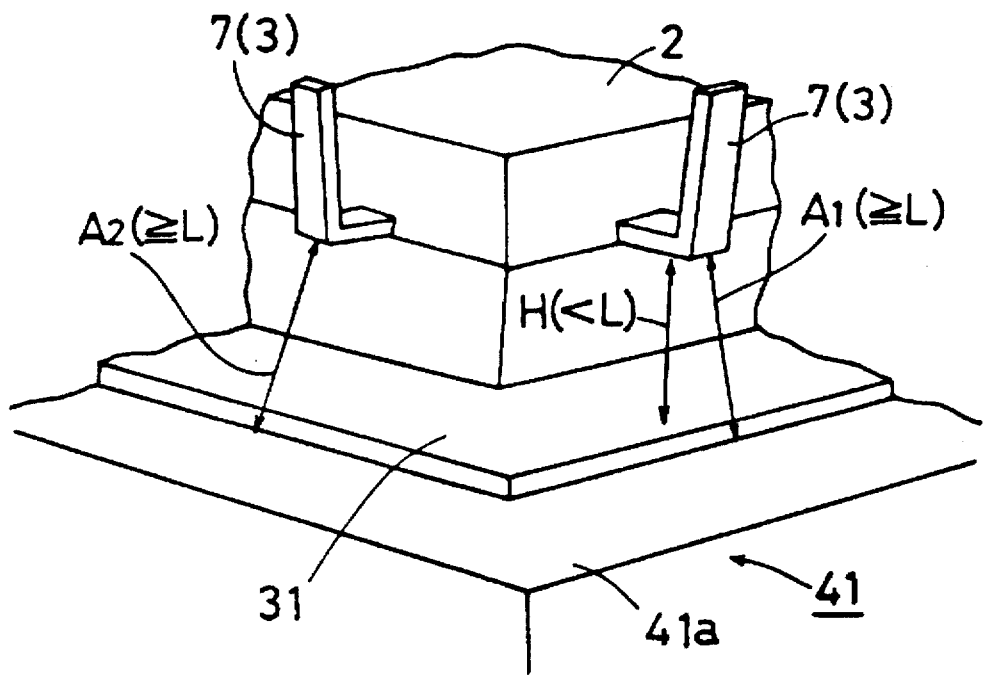
FIG. 9 is a perspective view showing usage of the semiconductor device and the insulation sheet of FIG. 8.

FIG. 9 is a fragmentary perspective view of the device 102 used being attached to the radiation fin 41. As shown in FIG. 9, the shape of the insulation sheet 31 is determined so that any of the spatial distances $A_1$, $A_2$ between each external terminal 7 and the peripheral edge of the insulation sheet 31 are equal to or larger than the permissible shortest spatial distance L. This allows the height H from the flat surface 41a to the external terminal 7 to be set smaller than the permissible shortest spatial distance L, which results in small-sizing the device 102.

Third Preferred Embodiment

In the above-described preferred embodiments, the insulation sheet is pressed between the step surface formed along the peripheral edge of the bottom of the sealing resin 2 and the flat surface 41a of the radiation fin 41. However, the surface shape of the "shoulder" of the sealing resin 2 from the external terminals 7 to the exposed surface of the heat sink 1 which is suitable for pressing the insulation sheet, i.e., the shape of the outer surface of the sealing resin 2 interposed between the external terminals 7 and the exposed surface of the heat sink 1 is not generally limited to the step shape as in the device 101. This preferred embodiment shows examples of semiconductor devices having the "shoulder" of the sealing resin 2 shaped other than like a step.

Figure 10:
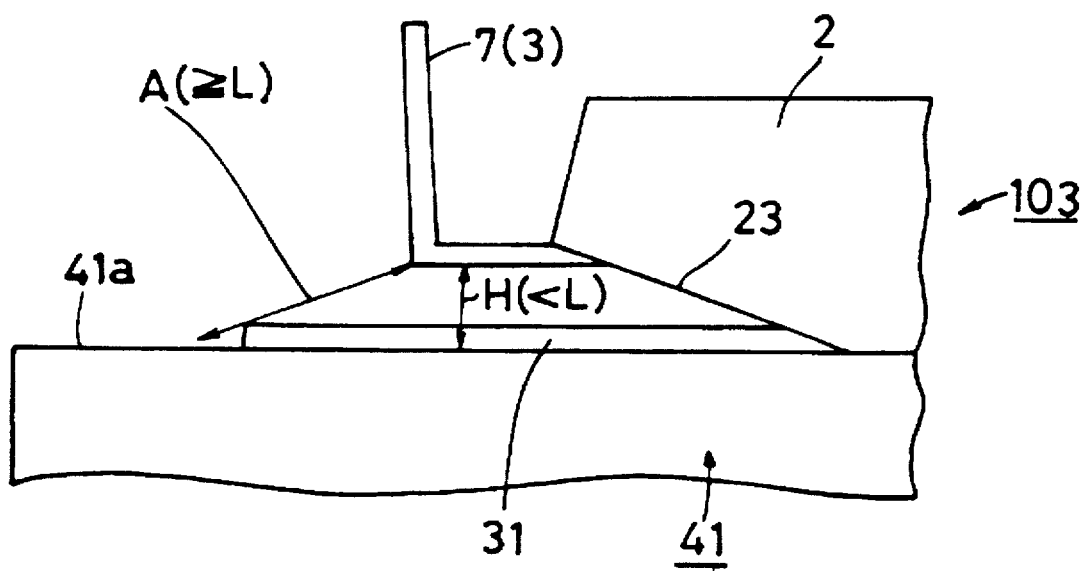
FIG. 10 is a front view showing usage of a semiconductor device of a third preferred embodiment.

In the device 103 shown in FIG. 10, the "shoulder" of the sealing resin 2 is formed of the surface 23 inclined at an obtuse angle close to 180° with respect to the exposed surface of the heat sink 1. That is to say, the part of the side wall of the sealing resin 2, where the external terminals 7 are arranged, from the external terminals 7 to the bottom of the sealing resin 2 (the part below the external terminal 7 on the side wall in FIG. 10) is formed in the inclined surface 23. This inclined surface 23 and the exposed surface of the heat sink 1 forming a gentle angle allows the insulation sheet 31 to be put between the flat surface 41a of the radiation fin 41 and the inclined surface 23 and to be pressed therebetween.

Figure 11:
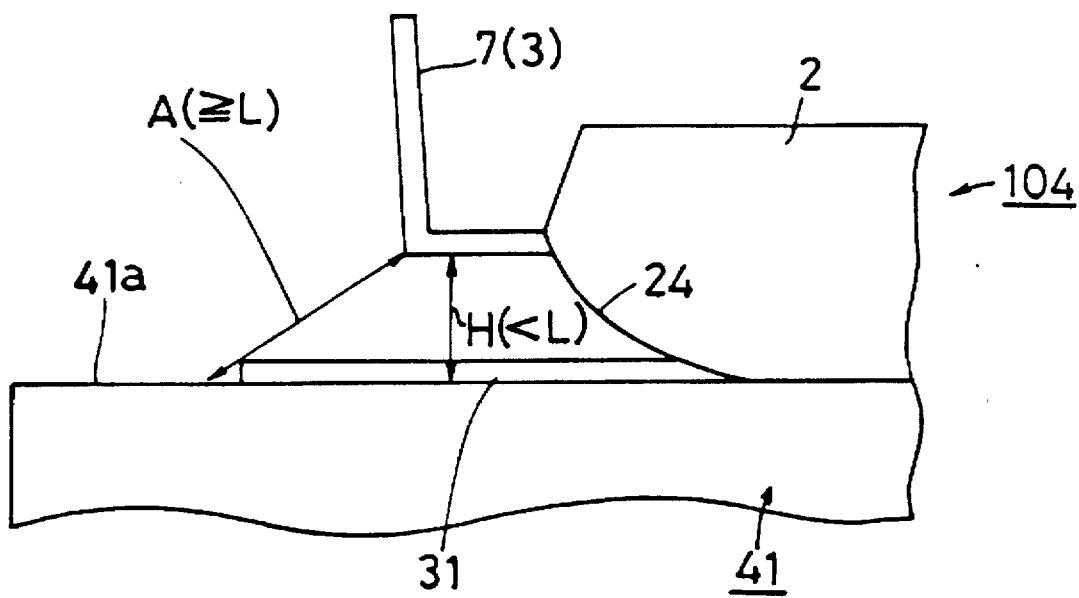
FIG. 11 is a front view showing usage of another example of the semiconductor device of the third preferred embodiment.

In the device 104 shown in FIG. 11, the "shoulder" of the sealing resin 2 is formed of a convex curved surface. That is to say, the part of the side wall of the sealing resin 2, where the external terminals 7 are arranged, from the external terminals 7 to the bottom of the sealing resin 2 (the part below the external terminal 7 in the side wall in FIG. 11) is formed of the convex curved surface 24. Accordingly, the insulation sheet 31 can be put and pressed between the flat surface 41a of the radiation fin 41 and the convex curved surface 24.

In any of the examples of FIG. 10 and FIG. 11, setting the shape of the insulation sheet 31 so that the spatial distance A is equal to or larger than the permissible shortest spatial distance L and the creeping distance C (not shown) is equal to or larger than the permissible shortest creeping distance S allows the height H to be set smaller than the permissible shortest spatial distance L.

Fourth Preferred Embodiment

Figure 12:
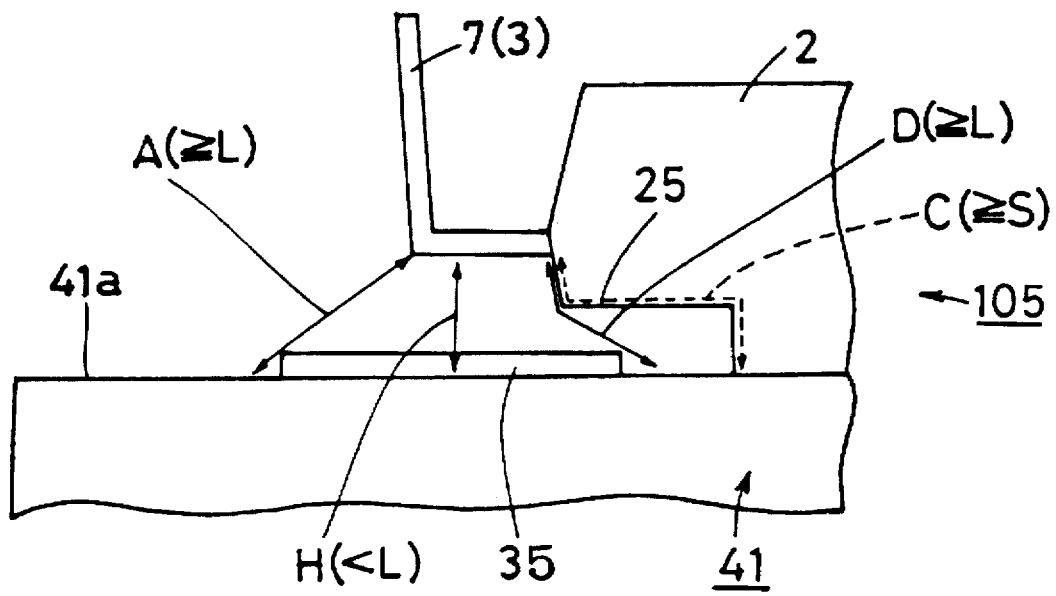
FIG. 12 is a front view showing usage of a semiconductor device of a fourth preferred embodiment.

In the above-described preferred embodiments, the insulation sheet is pressed by the "shoulder" of the sealing resin 2. By appropriately setting the shape of the "shoulder", however, the usage is possible where the insulation sheet is not pressed. FIG. 12 is a fragmentary front view showing the usage of the semiconductor device corresponding to such an example.

In this device 105, the "shoulder" of the sealing resin 2 has a step surface like the device 101. This step surface 25 has its surface shape optimized so that the creeping distance C along the outer surface of the sealing resin 2 from the external terminal 7 to the radiation fin 41 (in other words, to the peripheral edge of the peripheral portion 2a which is an abutting surface of the sealing resin 2 on the radiation fin 41) is equal to or larger than the permissible shortest creeping distance S. The height H is also set smaller than the permissible shortest spatial distance L.

As shown in FIG. 12, when using this device 105, the insulation sheet 35 is provided on the flat surface 41a of the radiation fin 41 to cover the region facing the external terminals 7. This insulation sheet 35 is not pressed between the step surface 25 and the flat surface 41a. That is to say, the insulation sheet 35 is not in contact with the device 105. Accordingly, the insulation sheet 35 is not included in the route defining the creeping distance between the external terminal 7 and the radiation fin 41. Accordingly, the shape and position of the insulation sheet 35 are determined considering only the spatial distance between the external terminal 7 and the radiation fin 41, in other words, the spatial distance A (, or D) between the external terminal 7 and the edge of the insulation sheet 35.

In the device 105 in which the insulation sheet 35 is not pressed by the step surface 25, the spatial discharge between the part of the flat surface 41a facing the step surface 25 and the external terminal 7 must also be considered. Hence, the shape and position of the insulation sheet 35 must be determined so that the spatial distance A between the external edge, seen from the device 105, of the insulation sheet 35 and the external terminal 7 and the spatial distance D between the internal edge and the external terminal 7 are both equal to or larger than the permissible shortest spatial distance L.

The insulation sheet 35 used with the device 105 does not have to have elasticity, so that a wide variety of insulating materials can be used as the insulation sheet 35, such as hard resin, ceramics, etc. Furthermore, as it is not necessary to press the insulation sheet 35 at the step surface 25, the depth of the step surface 25 from the exposed surface of the heat sink 1 can be arbitrarily set large without considering the thickness of the insulation sheet 35. The insulation sheet 35, not pressed, is fixed in a certain position on the flat surface 41a using an adhesive agent etc.

In the case where the high breakdown voltage terminals 8 (exemplified in FIG. 7) are limited to a part in the external terminals 7, the step surface 25 may be formed at least only in the part corresponding to the high breakdown voltage terminals 8, i.e., in the part of the outer surface of the sealing resin 2 interposed between the high breakdown voltage terminals 8 and the heat sink 1.

Fifth Preferred Embodiment

In the device 105 of the fourth preferred embodiment, the surface shape of the "shoulder" of the sealing resin 2 is like a step. Generally, however, the surface shape of the "shoulder" suitable for setting the creeping distance C along the outer surface of the sealing resin 2 equal to or larger than the permissible shortest creeping distance S is not limited to the shape of step as in the device 105. In this preferred embodiment, examples of semiconductor devices having the "shoulder" of the sealing resin 2 with its surface shape other than the step will be described.

Figure 13:
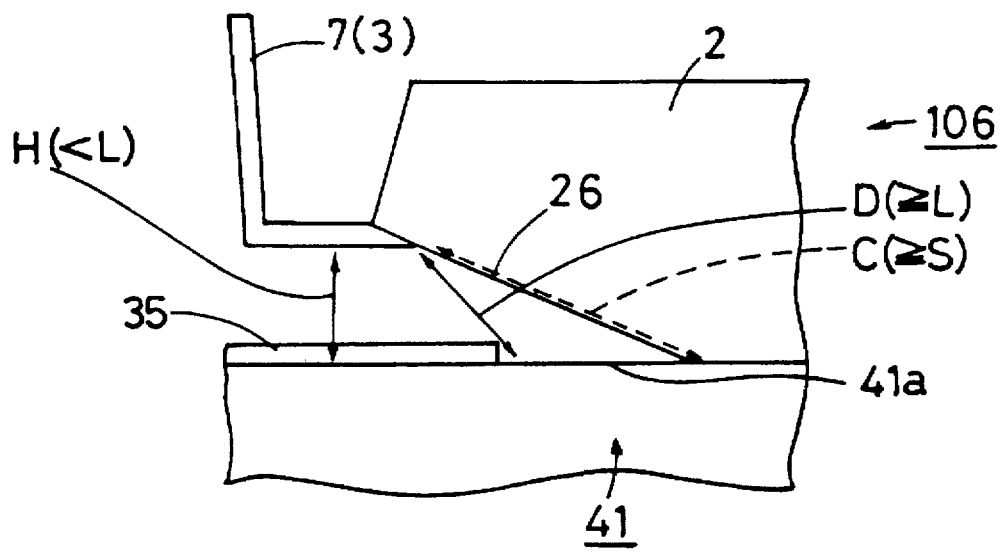
FIG. 13 is a front view showing usage of a semiconductor device of a fifth preferred embodiment.

In the device 106 exemplified in FIG. 13, the "shoulder" of the sealing resin 2 is formed in the inclined surface 26 forming an obtuse angle with respect to the exposed surface of the heat sink 1. That is to say, in the device 106, the "shoulder" of the sealing resin 2 is shaped similarly to that of the device 103 shown in FIG. 10.

This inclined surface 26 has its sectional form optimized so that the creeping distance C from the external terminal 7 to the radiation fin 41 (in other words, to the peripheral edge of the peripheral portion 2a of the sealing resin 2 abutting on the radiation fin 41) along the outer surface of the sealing resin 2 is equal to or larger than the permissible shortest creeping distance S. Furthermore, the height H is set smaller than the permissible shortest spatial distance L. The shape of the insulation sheet 35 and the arrangement position of the insulation sheet 35 relative to the external terminals 7 are set similarly to the fourth preferred embodiment shown in FIG. 12.

Figure 14:
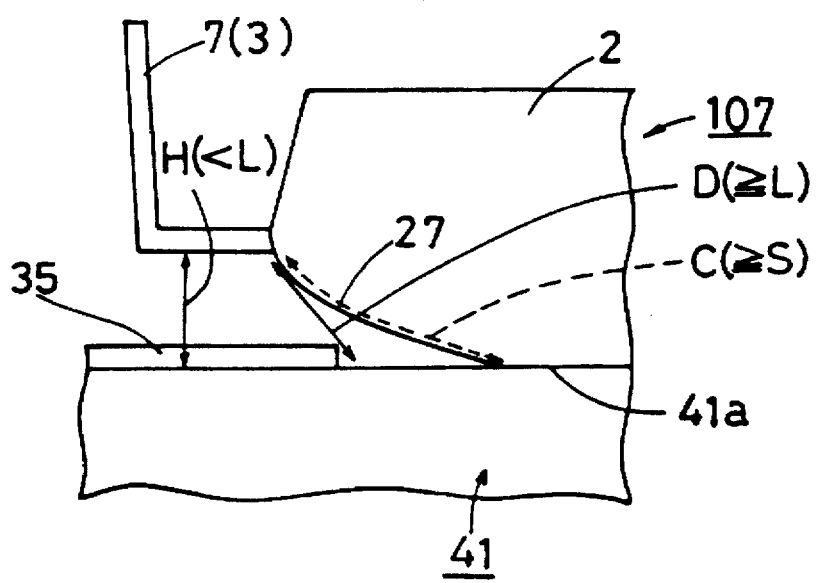
FIG. 14 is a front view showing usage of another example of the semiconductor device of the fifth preferred embodiment.
Figure 15:
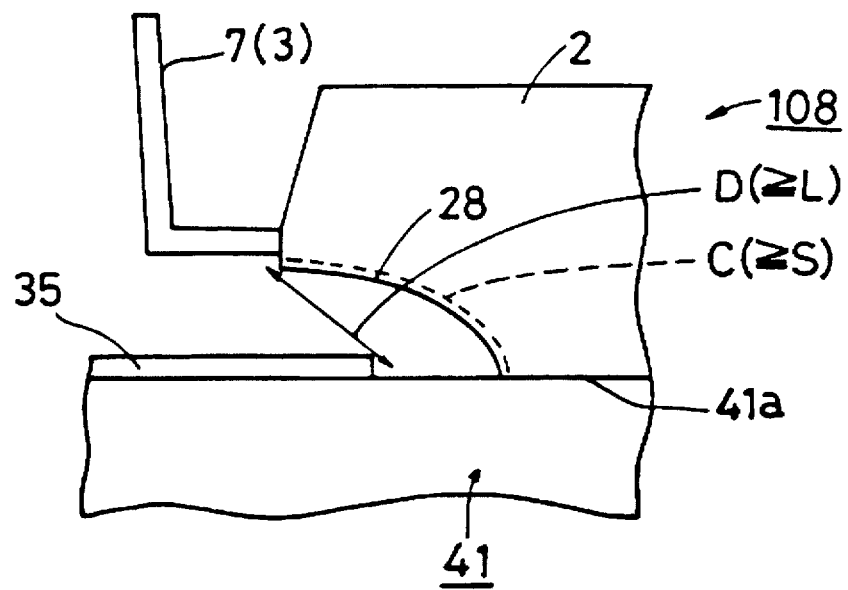
FIG. 15 is a front view showing usage of still another example of the semiconductor device of the fifth preferred embodiment.

In the device 107 exemplified in FIG. 14, like the device 104 shown in FIG. 11, the "shoulder" of the sealing resin 2 is formed of a convex curved surface 27. In the device 108 exemplified in FIG. 15, the "shoulder" of the sealing resin 2 is formed of a concave curved surface 28. The surface configurations of these convex curved surface 27 and the concave curved surface 28 are optimized so that the creeping distance C from the external terminal 7 to the radiation fin 41 along the outer surface of the sealing resin 2 is equal to or larger than the permissible shortest creeping distance S. Furthermore, the height H is set smaller than the permissible shortest spatial distance L. The shape of the insulation sheet 35 and the arrangement position of the insulation sheet 35 relative to the external terminals 7 are set similarly to the fourth preferred embodiment shown in FIG. 12.

Figure 16:
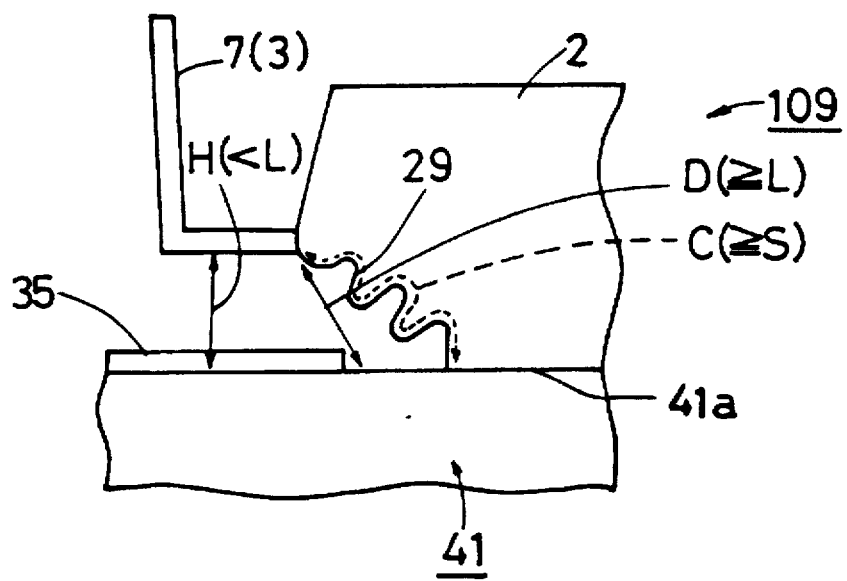
FIG. 16 is a front view showing the usage of a further example of the semiconductor device of the fifth preferred embodiment.

In the device 109 shown in FIG. 16, the "shoulder" of the sealing resin 2 is formed of the wavelike curved surface 29 with the convex curved surfaces and the concave curved surfaces alternately connected. The surface configuration of the wavelike curved surface 29 is optimized so that the creeping distance C from the external terminal 7 to the radiation fin 41 along the outer surface of the sealing resin 2 is equal to or larger than the permissible shortest creeping distance S. Furthermore, the height H is set smaller than the permissible shortest spatial distance L. The shape of the insulation sheet 35 and the arrangement position of the insulation sheet 35 relative to the external terminals 7 are set similarly to the fourth preferred embodiment shown in FIG. 12.

The shapes of the "shoulder" of the sealing resin 2 shown above are all suitable for ensuring the large creeping distance C. Especially, the wavelike curved surface 29 can be said to be the best form to set the creeping distance C to the largest. The inclined surface 26 having the simplest configuration provides the advantage that the production is easiest.

Sixth Preferred Embodiment

The first through fifth preferred embodiments described above have compatibly realized high breakdown voltage and downsizing of the semiconductor device by providing the insulation sheet on the radiation fin 41. In this preferred embodiment, a semiconductor device and a radiation fin will be described which compatibly realize the high breakdown voltage and downsizing without using the insulation sheet.

Figure 17:
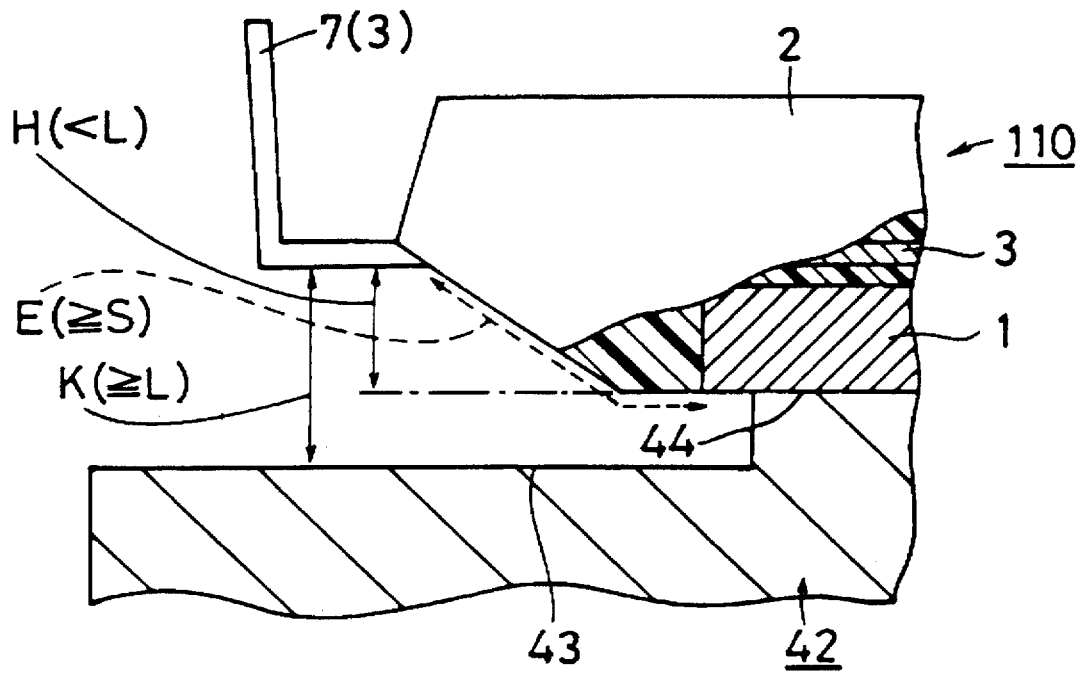
FIG. 17 is a front view showing the usage of a semiconductor device of a sixth preferred embodiment.

In the device 110 shown in FIG. 17, the shape of the sealing resin 2 is set so that the creeping distance E along the outer surface of the sealing resin 2 between the heat sink 1 exposed in the bottom of the sealing resin 2 and the external terminal 7 is equal to or larger than the permissible shortest creeping distance S. The height H of the external terminal 7 measured from the exposed surface of the heat sink 1 is set smaller than the permissible shortest spatial distance L. That is to say, the device 110 is sized smaller than the conventional device.

This device 110 can be attached to the radiation fin(heat radiating means) 42 having the sectional form shown in FIG. 17 to ensure a certain breakdown voltage. The radiation fin 42 has the step surface 43 retracted from the flat surface 44 in surface contact with the exposed surface of the heat sink 1. The step surface 43 is provided in the region facing the external terminals 7.

The boundary between the flat surface 44 and the step surface 43 coincides with the periphery of the exposed surface of the heat sink 1, or it is retracted more inside. (FIG. 17 shows an example of the retracted one.) Accordingly, the creeping distance between the external terminal 7 and the radiation fin 42 is never less than the creeping distance E unique to the device 110.

The step width between the flat surface 44 and the step surface 43 is set so that the height K of the external terminal 7 measured from the step surface 43 is equal to or larger than the permissible shortest spatial distance L. Accordingly, by using the device 110 in combination with the radiation fin 42, the breakdown voltage of the device 110 can be realized as rated.

FIG. 17 shows an example in which the boundary between the flat surface 44 and the step surface 43 is retracted inside of the periphery of the exposed surface of the heat sink 1. When the creeping distance E in the device 110 is larger enough than the permissible shortest creeping distance S, however, the flat surface 44 can protrude out of the exposed surface of the heat sink 1 in the range where the creeping distance from the external terminal 7 to the flat surface 44 is not under the permissible shortest creeping distance S.

Figure 18:
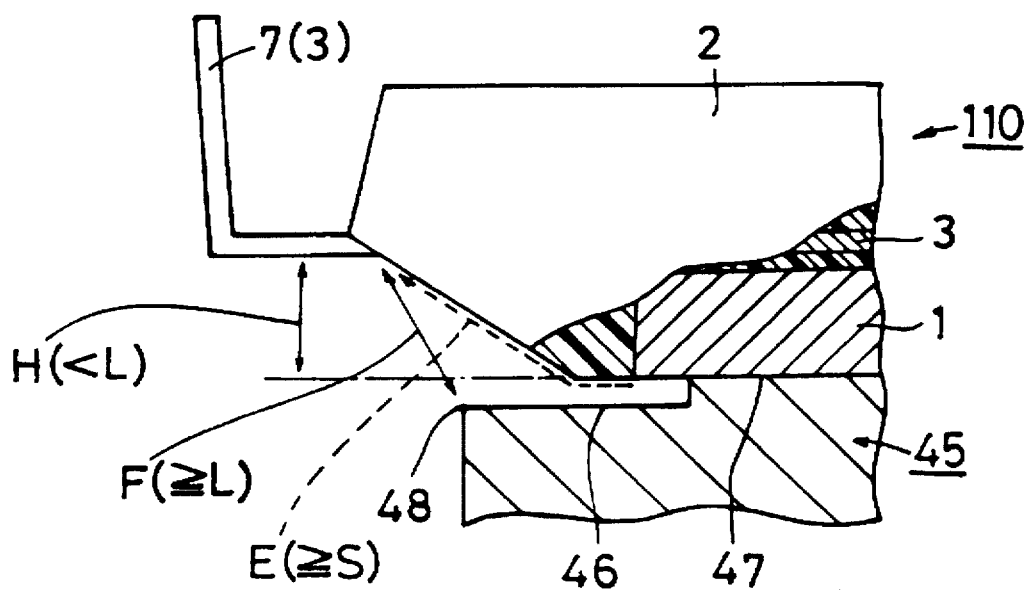
FIG. 18 is a front view showing another usage of the semiconductor device of FIG. 17.

The radiation fin 45 shown in FIG. 18 has the flat surface 47 and the retracted step surface 46, like the radiation fin 42. In this radiation fin 45, however, the outline of the step surface 46 is limited. That is to say, the outline form of the step surface 46 and the position where the device 110 is attached to the radiation fin 42 are determined so that the step surface 46 does not exist in the region right under the external terminals 7, i.e., in the region facing the external terminals 7, but it exists only out of the region where the spatial distance from the external terminal 7 is smaller than the permissible shortest spatial distance L. That is to say, the spatial distance F between the outer periphery 48 of the step surface 46 and the external terminal 7 is set equal to or larger than the permissible shortest spatial distance L.

In this way, in the radiation fin 45, the outline form of the step surface 46 is limited so that the spatial distance between the external terminal 7 and the radiation fin 45 is equal to or larger than the permissible shortest spatial distance L. Accordingly, unlike the radiation fin 42 shown in FIG. 17, the degree of freedom in design is increased with respect to the step width of the step surface 46.

If the high breakdown voltage terminals 8 (shown in FIG. 7) are limited to a part in the external terminals 7, needless to say, for the step surface 43 (FIG. 17) and the step surface 46 (FIG. 18), it is not necessary to consider the spatial distance from all external terminals 7, but it is enough to consider only the spatial distance from the high breakdown terminals 8.

Seventh Preferred Embodiment

In the first through sixth preferred embodiments described above, the semiconductor device has the heat sink, through which the loss heat is radiated to the external radiation fin. In this preferred embodiment, a description will be made on a semiconductor device capable of radiation of loss heat directly to the radiation fin without through the heat sink.

Figure 19:
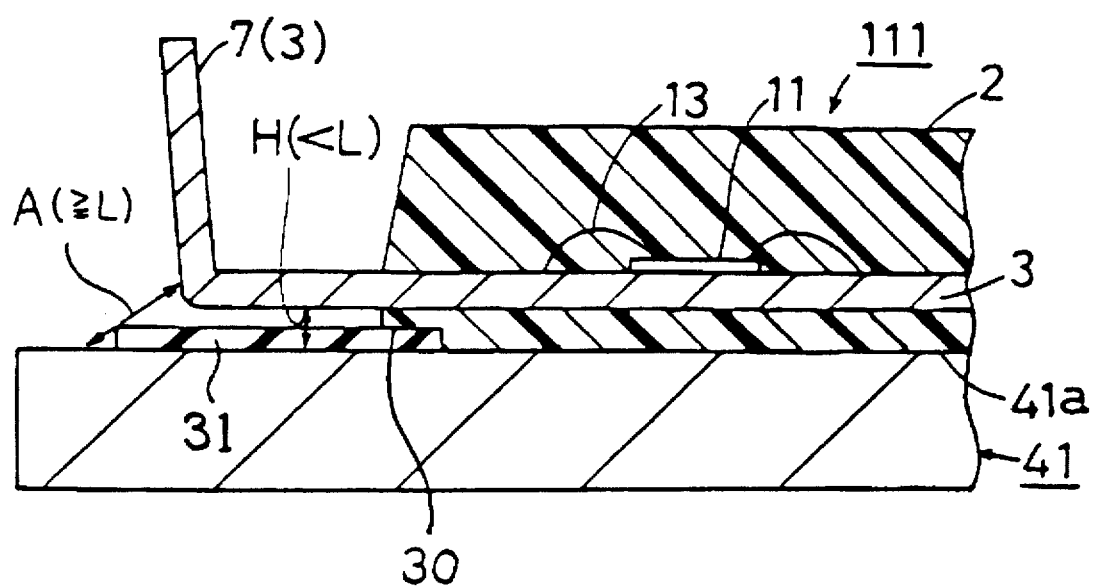
FIG. 19 is a front view showing the usage of a semiconductor device of a seventh preferred embodiment.
Figure 20:
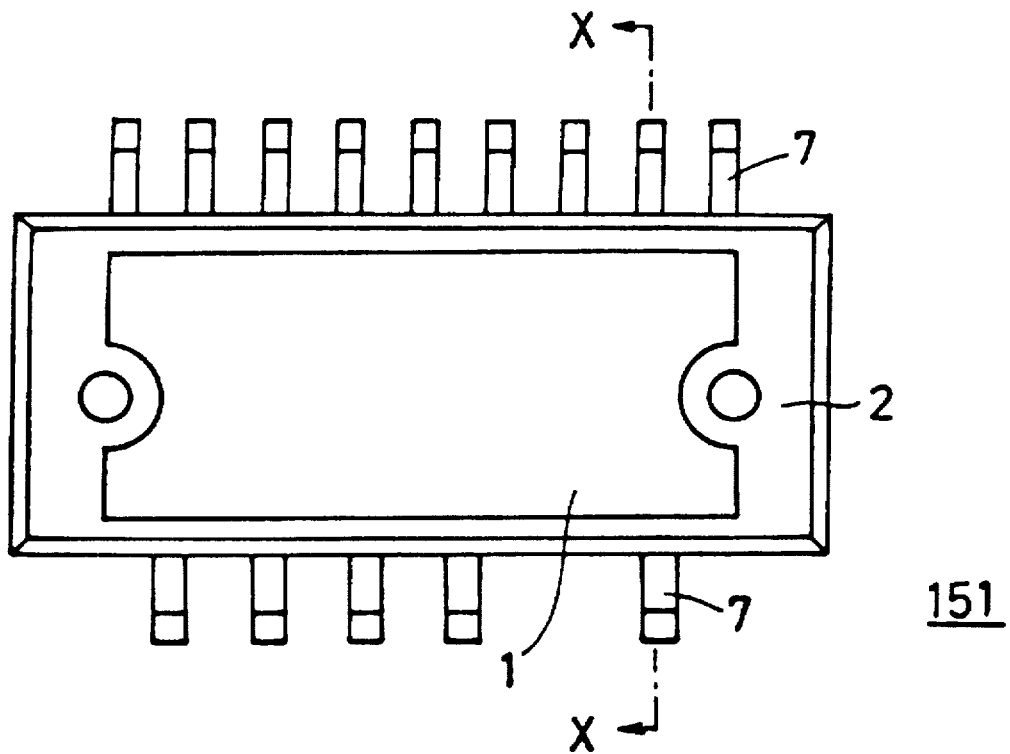
FIG. 20 is a bottom view of a conventional semiconductor device.
Figure 21:
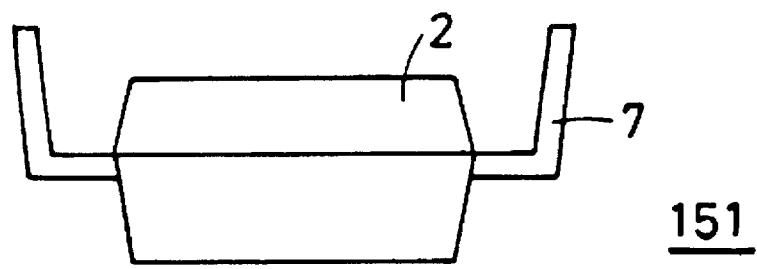
FIG. 21 is a front view of the semiconductor device of FIG. 20.
Figure 22:
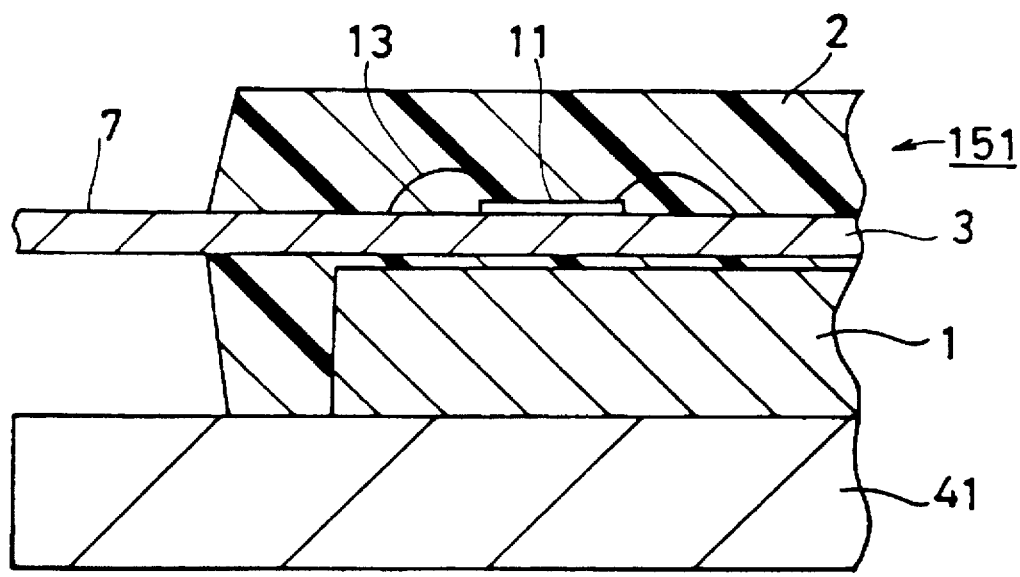
FIG. 22 is a front sectional view showing the usage of the semiconductor device of FIG. 20.

In the device 111 shown in FIG. 19, the lower main surface of the lead frame 3 is covered with the sheet-like or plate-like sealing resin 2. It has no heat sink. The sealing resin 2 covering the lower main surface of the lead frame 3 has a flat surface parallel to the lead frame 3 on its surface. The device 111 is fixed in use to the radiation fin 41 so that the flat surface of the sealing resin 2 directly comes in surface contact with the flat surface 41a of the radiation fin 41.

The thickness of the sealing resin 2 covering the lower main surface of the lead frame 3 is set thin to such an extent that heat conduction from the lead frame 3 to the radiation fin 41 is not prevented. Furthermore, this thickness, or the height H of the external terminal 7 from the flat surface of the sealing resin 2 is set smaller than the permissible spatial distance L corresponding to the rated voltage of the device. This thickness almost corresponds to the thickness of the sealing resin 2 filling the interval between the lead frame 3 and the heat sink 1 in the device 101 of the first preferred embodiment, for example.

The step surface 30 retracted from the flat surface of the sealing resin 2 is formed along the portion corresponding to the external terminals 7 in the peripheral edge of the sealing resin 2 covering the lower main surface of the lead frame 3. When using the device 111, the insulation sheet 31 is prepared and the edge of the insulation sheet 31 is put between the step surface 30 and the flat surface 41a of the radiation fin 41, and is pressed. The insulation sheet 31 is disposed to cover the region of the flat surface 41a facing the external terminals 7.

Accordingly, the usage of the device 111 can be shown in the figure as if it were similar to the perspective views of FIG. 3, FIG. 5 or FIG. 9 of the first preferred embodiment. The outline configuration of the insulation sheet 31 is also set so that the spatial distances A, B and the creeping distance C between the radiation fin 41 and the external terminals 7 are equal to or larger than the permissible spatial distance L and the permissible creeping distance S, respectively, similarly to FIG. 3, for example.

In this way, the device 111 having the step surface 30 enables appropriate use of the insulation sheet 31. This allows the height H of the external terminal 7 from the flat surface of the sealing resin 2 to be set smaller than the permissible spatial distance L and the breakdown voltage between the external terminal 7 and the radiation fin 41 (ground potential) to be realized as the rated value. Furthermore, as the height H is set small to such an extent that heat conduction between the lead frame 3 and the radiation fin 41 is not prevented, the device 111 is considerably downsized. Furthermore, since the heat sink is not provided, the manufacturing cost of the device is reduced.

Also in this preferred embodiment, when the high breakdown voltage terminals 8 (exemplified in FIG. 7) are limited to part of the plurality of external terminals 7, it is sufficient that the step surface 30 and the insulation sheet 31 are provided corresponding only to the high breakdown voltage terminals 8.

While the invention has been described in detail, the foregoing description is in all aspects illustrative and not restrictive. It is understood that numerous other modifications and variations can be devised without departing from the scope of the invention.

We claim:

1. A semiconductor device, comprising:

a lead frame having a planar portion being electrically conductive and having first and second main surfaces and having therearound a plurality of external terminals outwardly projecting;

a power semiconductor element fixed on said first main surface;

a heat sink like a plate being thermally conductive and having third and fourth main surfaces and provided so that said third main surface faces said second main surface with a gap therebetween; and a sealing resin having electrically insulating properties and sealing said power semiconductor element, said lead frame, and said heat sink arranged so that said plurality of external terminals and said fourth main surface are exposed to an outside, said plurality of external terminals includes a high breakdown voltage terminal that sets a breakdown voltage for the device, where the breakdown voltage corresponds to a rated voltage for said device developed between said high voltage terminal and said heat sink;

a portion interposed between said high breakdown voltage terminal and said fourth main surface in an outer surface of said sealing resin has a surface shape capable of pressing and holding a sheet having elasticity with an external flat surface in surface contact with said fourth main surface, and a height of said plurality of external terminals measured from said fourth main surface is smaller than a permissible shortest spatial distance, which is a reference value corresponding to said rated voltage for said device.

2. The semiconductor device according to claim 1, wherein said portion of said outer surface is stepped with a portion recessed from said fourth main surface.

3. The semiconductor device according to claim 1, wherein said portion of said outer surface has a surface inclined at a gentle angle with respect to said fourth main surface to such an extent that said sheet can be pressed and held.

4. The semiconductor device according to claim 1, wherein said portion of said outer surface has a convex curved surface.

5. A semiconductor device, comprising:

a lead frame having a planar portion being electrically conductive and having first and second main surfaces and having therearound a plurality of external terminals outwardly projecting;

a power semiconductor element fixed on said first main surface;

a heat sink like a plate being thermally conductive and having third and fourth main surfaces and provided so that said third main surface faces said second main surface with a gap therebetween; and a sealing resin having electrically insulating properties and sealing said power semiconductor element, said lead frame, and said heat sink arranged so that said plurality of external terminals and said fourth main surface are exposed to an outside;

said plurality of external terminals includes a high breakdown voltage terminal that sets a breakdown voltage for the device, where the breakdown voltage corresponds to a rated voltage for said device developed between said high voltage terminal and said heat sink, wherein a creeping distance along a creepage path between said high breakdown voltage terminal and said heat sink along an outer surface of said sealing resin is equal to or larger than a permissible shortest creeping distance corresponding to said rated voltage, and a height of said external terminals measured from said fourth main surface is smaller than a permissible shortest spatial distance, which is a reference value corresponding to said rated voltage for said device.

6. The semiconductor device according to claim 5, wherein said outer surface has a peripheral portion surrounding said fourth main surface and forming the same plane with said fourth main surface, another creeping distance along another creepage path between said high breakdown voltage terminal and said peripheral portion along said outer surface is equal to or larger than the permissible shortest creeping distance corresponding to said rated voltage, and a spatial distance between said high breakdown voltage terminal and said peripheral portion is equal to or larger than the permissible shortest spatial distance corresponding to said rated voltage.

7. The semiconductor device according to claim 6, wherein a portion interposed between said high breakdown voltage terminal and said heat sink in said outer surface has a step surface which is retracted from said fourth main surface.

8. The semiconductor device according to claim 6, wherein a portion interposed between said high breakdown voltage terminal and said heat sink in said outer surface has a surface inclined at an obtuse angle with respect to said fourth main surface.

9. The semiconductor device according to claim 6, wherein a portion interposed between said high breakdown voltage terminal and said heat sink in said outer surface has a curved surface.

10. The semiconductor device according to claim 9, wherein said curved surface is a convex curved surface.

11. The semiconductor device according to claim 9, wherein said curved surface is a concave curved surface.

12. The semiconductor device according to claim 9, wherein said curved surface is a wavelike curved surface having a convex curved surface and a concave curved surface connected alternately.

13. A semiconductor device, comprising:

a lead frame having a planar portion being electrically conductive and having first and second main surfaces and having therearound a plurality of external terminals outwardly projecting;

a power semiconductor element fixed on said first main surface; and a sealing resin having electrically insulating properties and sealing said power semiconductor element and said lead frame so that said plurality of external terminals are exposed to an outside;

said plurality of external terminals includes a high breakdown voltage terminal that sets a breakdown voltage for the device, where the breakdown voltage corresponds to a rated voltage for said device developed between said high voltage terminal and a ground potential; wherein said sealing resin has a portion covering said second main surface of said lead frame, an outer surface of said portion has a flat plane on the side opposite to said lead frame, a height of said plurality of external terminals from said flat plane is smaller than a permissible shortest spatial distance, which is a reference value corresponding to said rated voltage, and said outer surface of said portion further has a step surface which is retracted from said flat plane in a portion interposed between said high breakdown voltage terminal and said flat plane.

14. A semiconductor module, comprising:

an insulation sheet having electrically insulating properties and elasticity;

a heat radiating means being thermally conductive and having a flat surface; and a semiconductor device comprising, a lead frame having a planar portion being electrically conductive and having first and second main surfaces and having therearound a plurality of external terminals outwardly projecting, a power semiconductor element fixed on said first main surface, a heat sink like a plate being thermally conductive and having third and fourth main surfaces and provided so that said third main surface faces said second main surface with a gap therebetween, a sealing resin having electrically insulating properties and sealing said power semiconductor element, said lead frame, and said heat sink arranged so that said plurality of external terminals and said fourth main surface are exposed to an outside, and said plurality of external terminals includes a high breakdown voltage terminal that sets a breakdown voltage for the device, where the breakdown voltage corresponds to a rated voltage for said device developed between said high voltage terminal and said heat sink, wherein said semiconductor device is fixed to said heat radiating means so that said fourth main surface is in surface contact with said flat surface, a portion interposed between said high breakdown voltage terminal and said fourth main surface in an outer surface of said sealing resin has a surface shape capable of pressing and holding said insulation sheet with said flat surface, a height of said plurality of external terminals measured from said fourth main surface is smaller than a permissible shortest spatial distance, which is a reference value corresponding to said rated voltage, and said insulation sheet is held and pressed at its edge portion between said portion of said outer surface and said flat surface and covers a region of said flat surface facing said high breakdown voltage terminal so that a spatial distance and a creeping distance along a creepage path between said high breakdown voltage terminal and said flat surface are equal to or larger than the permissible shortest spatial distance and a permissible shortest creeping distance corresponding to said rated voltage, respectively.

15. A semiconductor module, comprising:

an insulation sheet having electrically insulating properties;

a heat radiating means being thermally conductive and having a flat surface; and a semiconductor device comprising, a lead frame having a planar portion being electrically conductive and having first and second main surfaces and having therearound a plurality of external terminals outwardly projecting, a power semiconductor element fixed on said first main surface, a heat sink like a plate being thermally conductive and having third and fourth main surfaces and provided so that said third main surface faces said second main surface with a gap therebetween, a sealing resin having electrically insulating properties and sealing said power semiconductor element, said lead frame, and said heat sink arranged so that said plurality of external terminals and said fourth main surface are exposed to an outside, and said plurality of external terminals includes a high breakdown voltage terminal that sets a breakdown voltage for the device, where the breakdown voltage corresponds to a rated voltage which is a rated value of the breakdown voltage and is developed between said high voltage terminal and said heat sink, wherein said semiconductor device is fixed to said heat radiating means so that said fourth main surface is in surface contact with said flat surface, a creeping distance along a creepage path between said high breakdown voltage terminal and said heat sink along an outer surface of said sealing resin is equal to or larger than a permissible shortest creeping distance corresponding to said rated voltage, a height of said plurality of external terminals measured from said fourth main surface is smaller than a permissible shortest spatial distance, which is a reference value corresponding to said rated voltage, and said insulation sheet covers a region of said flat surface facing said high breakdown voltage terminal so that a spatial distance and another creeping distance along another creepage path between said high breakdown voltage terminal and said flat surface are equal to or larger than the permissible shortest spatial distance and the permissible shortest creeping distance corresponding to said rated voltage, respectively.

16. A semiconductor module, comprising:

a heat radiating means being thermally conductive and having a flat surface;

a semiconductor device comprising, a lead frame having a planar portion being electrically conductive and having first and second main surfaces and having therearound a plurality of external terminals outwardly projecting, a power semiconductor element fixed on said first main surface, a heat sink like a plate being thermally conductive and having third and fourth main surfaces and provided so that said third main surface faces said second main surface with a gap therebetween, a sealing resin having electrically insulating properties and sealing said power semiconductor element, said lead frame, and said heat sink arranged so that said plurality of external terminals and said fourth main surface are exposed to an outside, and said plurality of external terminals includes a high breakdown voltage terminal that sets a breakdown voltage for the device, where the breakdown voltage corresponds to a rated voltage which is a rated value of the breakdown voltage and is developed between said high voltage terminal and said heat sink, wherein said semiconductor device is fixed to said heat radiating means so that said fourth main surface is in surface contact with said flat surface, a creeping distance along a creepage path between said high breakdown voltage terminal and said heat sink along an outer surface of said sealing resin is equal to or larger than a permissible shortest creeping distance corresponding to said rated voltage, a height of said plurality of external terminals measured from said fourth main surface is smaller than a permissible shortest spatial distance, which is a reference value corresponding to said rated voltage, and said heat radiating means has a step surface portion that is recessed from said flat surface in a region facing said high breakdown voltage terminal so that a spatial distance and another creeping distance along another creepage path between said heat radiating means and said high breakdown voltage terminal are equal to or larger than the permissible shortest spatial distance and the permissible shortest creeping distance corresponding to said rated voltage, respectively.

17. A semiconductor module, comprising:

a heat radiating means being thermally conductive and having a flat surface; and a semiconductor device comprising, a lead frame having a planar portion being electrically conductive and having first and second main surfaces and having therearound a plurality of external terminals outwardly projecting, a power semiconductor element fixed on said first main surface, a heat sink like a plate being thermally conductive and having third and fourth main surfaces and provided so that said third main surface faces said second main surface with a gap therebetween, and a sealing resin having electrically insulating properties and sealing said power semiconductor element, said lead frame, and said heat sink arranged so that said plurality of external terminals and said fourth main surface are exposed to an outside, and said plurality of external terminals includes a high breakdown voltage terminal that sets a breakdown voltage for the device, where the breakdown voltage corresponds to a rated voltage which is a rated value of the breakdown voltage and is developed between said high voltage terminal and said heat sink, wherein said semiconductor device is fixed to said heat radiating means so that said fourth main surface is in surface contact with said flat surface, a creeping distance along a creepage path between said high breakdown voltage terminal and said heat sink along an outer surface of said sealing resin is equal to or larger than a permissible shortest creeping distance corresponding to said rated voltage, a height of said plurality of external terminals measured from said fourth main surface is smaller than a permissible shortest spatial distance, which is a reference value corresponding to said rated voltage, and said heat radiating means has a step surface portion that is recessed from said flat surface but not extending to a region that faces said high breakdown voltage terminal so that a spatial distance and another creeping distance along another creepage path between said heat radiating means and said high breakdown voltage terminal are equal to or larger than the permissible shortest spatial distance and the permissible shortest creeping distance corresponding to said rated voltage, respectively.

18. A semiconductor module, comprising:

an insulation sheet having electrically insulating properties and elasticity;

a heat radiating means being thermally conductive and having a flat surface; and a semiconductor device comprising, a lead frame having a planar portion being electrically conductive and having first and second main surfaces and having therearound a plurality of external terminals outwardly projecting, a power semiconductor element fixed on said first main surface, a sealing resin having electrically insulating properties and sealing said power semiconductor element and said lead frame so that said plurality of external terminals are exposed to an outside, wherein said sealing resin has a portion covering said second main surface of said lead frame, an outer surface of said portion has a flat plane on a side opposite to said lead frame, said semiconductor device is fixed to said heat radiating means so that said flat plane is in surface contact with said flat surface, said plurality of external terminals includes a high breakdown voltage terminal that sets a breakdown voltage for the device, where the breakdown voltage corresponds to a rated voltage which is a rated value of the breakdown voltage and is developed between said high voltage terminal and said heat sink, a height of said plurality of external terminals from said flat plane is smaller than a permissible shortest spatial distance, which is a reference value corresponding to said rated voltage, said outer surface of said portion further has a step surface which is retracted from said flat plane in a portion interposed between said high breakdown voltage terminal and said flat plane, and said insulation sheet is held and pressed at its edge portion between said step surface and said flat surface and covers a region facing said high breakdown voltage terminal in said flat surface so that a spatial distance and a creeping distance along a creepage path between said high breakdown voltage terminal and said flat surface are equal to or larger than the permissible shortest spatial distance and a permissible shortest creeping distance corresponding to said rated voltage, respectively.

* * * * *